United States Patent
Woo et al.

(10) Patent No.: US 11,665,884 B2
(45) Date of Patent: May 30, 2023

(54) SEMICONDUCTOR DEVICE WITH CAPPING CONDUCTIVE LAYER ON AN ELECTRODE AND METHOD OF FABRICATING THE SAME

(71) Applicant: SAMSUNG ELECTRONICS CO., LTD., Suwon-si (KR)

(72) Inventors: Chang-Su Woo, Seoul (KR); Haeryong Kim, Seongnam-si (KR); Younsoo Kim, Yongin-si (KR); Sunmin Moon, Yongin-si (KR); Jeonggyu Song, Seongnam-si (KR); Kyooho Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/172,131

(22) Filed: Feb. 10, 2021

(65) Prior Publication Data

US 2021/0384194 A1  Dec. 9, 2021

(30) Foreign Application Priority Data

Jun. 3, 2020 (KR) .................. 10-2020-0067291

(51) Int. Cl.
  *H01L 21/768* (2006.01)
  *H01L 23/522* (2006.01)
  *H01L 27/108* (2006.01)

(52) U.S. Cl.
  CPC ......... *H10B 12/315* (2023.02); *H10B 12/033* (2023.02); *H10B 12/34* (2023.02)

(58) Field of Classification Search
  CPC ......... H01L 27/10814; H01L 27/10823; H01L 27/10852
  See application file for complete search history.

(56) References Cited

U.S. PATENT DOCUMENTS 7,018,933 B2  3/2006  Kim et al.
7,563,715 B2  7/2009  Haukka et al.
(Continued)

FOREIGN PATENT DOCUMENTS

KR  10-0604845 B1  7/2006
KR  10-2010-0119445 A  11/2010
(Continued)

OTHER PUBLICATIONS

Mackus, et al. "From the Bottom-Up: Toward Area-Selective Atomic Layer Deposition with High Selectivity," Chemistry of Materials; 2019. Published: Dec. 19, 2018.

*Primary Examiner* — Marcos D. Pizarro
*Assistant Examiner* — Tenley H Schofield
(74) *Attorney, Agent, or Firm* — Lee IP Law, P.C.

(57) ABSTRACT

A semiconductor device includes conductive pillars on a semiconductor substrate, a first support pattern that contacts first portions of lateral surfaces of the conductive pillars and connects the conductive pillars to each other, the first support pattern including first support holes that expose second portions of the lateral surfaces of the conductive pillars, a capping conductive pattern that contacts the second portions of the lateral surfaces of the conductive pillars and exposes the first support pattern, the second portions of the lateral surfaces of the conductive pillars being in no contact with the first support pattern, and a dielectric layer that covers the first support pattern and the capping conductive pattern, the dielectric layer being spaced apart from the conductive pillars.

20 Claims, 26 Drawing Sheets

(56) References Cited

U.S. PATENT DOCUMENTS

| | | |
|---|---|---|
| 8,288,241 B2 | 10/2012 | Hirota et al. |
| 10,490,623 B2 | 11/2019 | Yi et al. |
| 2005/0227432 A1 | 10/2005 | Choi et al. |
| 2011/0204427 A1 | 8/2011 | Choi et al. |
| 2012/0273921 A1 | 11/2012 | Do et al. |
| 2016/0104763 A1* | 4/2016 | Choi ................ H01L 28/75 |
| | | 257/532 |
| 2018/0166449 A1* | 6/2018 | Pak ............. H01L 27/10852 |
| 2018/0240800 A1* | 8/2018 | Ahn .................. H01L 28/90 |
| 2019/0165088 A1* | 5/2019 | Cho ............. H01L 21/02672 |
| 2019/0355806 A1* | 11/2019 | Kang ................ H01G 9/042 |
| 2020/0105633 A1* | 4/2020 | Lee .................. H01L 28/40 |

FOREIGN PATENT DOCUMENTS

| | | |
|---|---|---|
| KR | 10-2012-0122548 A | 11/2012 |
| KR | 10-1583516 B1 | 1/2016 |

\* cited by examiner

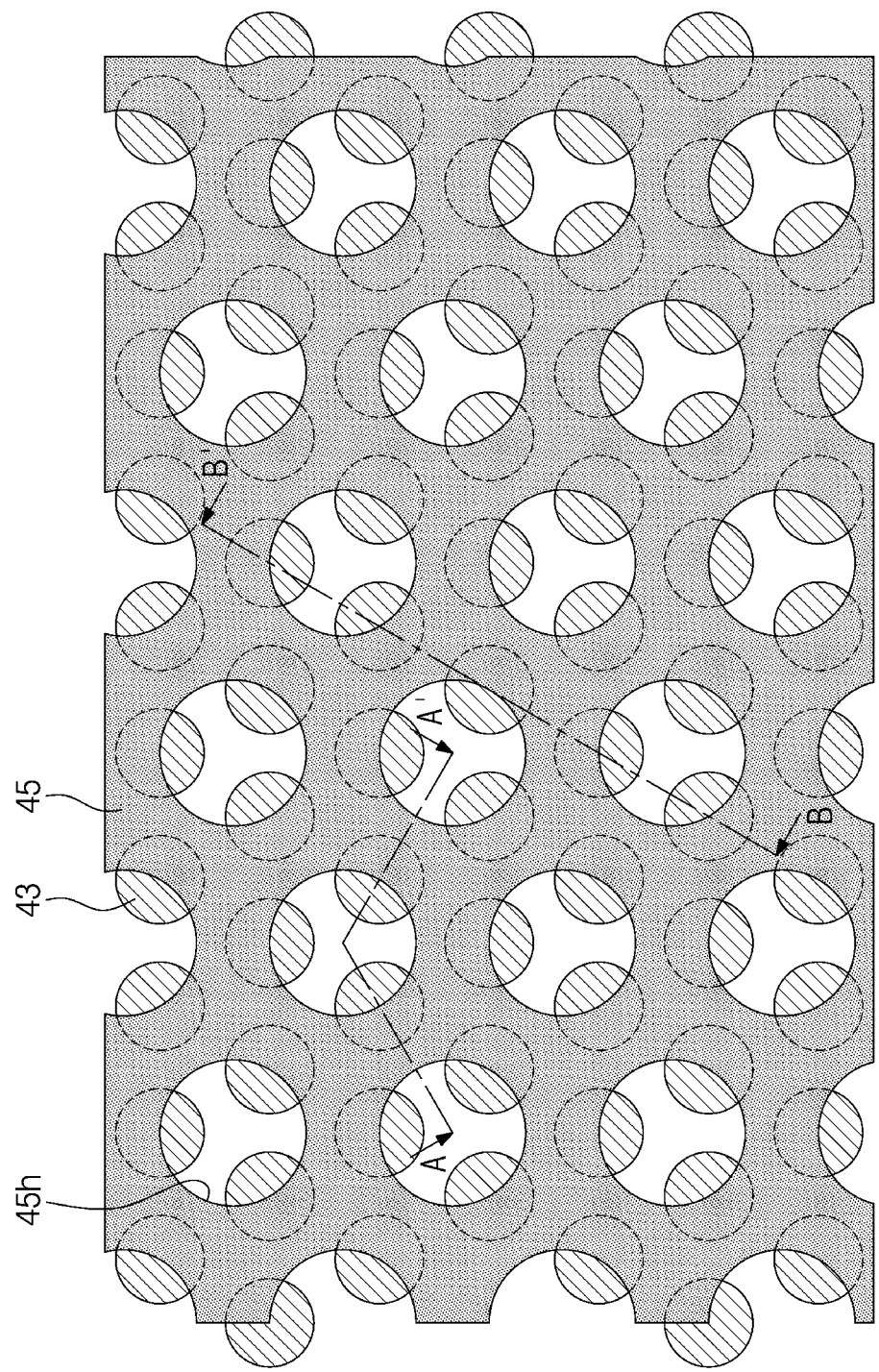

SEMICONDUCTOR DEVICE WITH CAPPING CONDUCTIVE LAYER ON AN ELECTRODE AND METHOD OF FABRICATING THE SAME

CROSS-REFERENCE TO RELATED APPLICATION

Korean Patent Application No. 10-2020-0067291, filed on Jun. 3, 2020, in the Korean Intellectual Property Office, and entitled: "Semiconductor Device and Method of Fabricating the Same," is incorporated by reference herein in its entirety.

BACKGROUND

1. Field

The present disclosure relates to a semiconductor device and a method of fabricating the same.

2. Description of the Related Arts

Semiconductor devices have an important role in the electronic industry because of their small size, multi-functionality, and/or low fabrication cost. The semiconductor devices are being highly integrated with the remarkable development of the electronic industry.

SUMMARY

According to some example embodiments, a semiconductor device may include a plurality of conductive pillars on a semiconductor substrate, a first support pattern that partially contacts lateral surfaces of the conductive pillars and connects the conductive pillars to each other, the first support pattern including a plurality of first support holes that expose other lateral surfaces of the conductive pillars, a capping conductive pattern that contacts exposed surfaces of the conductive pillars and exposes the first support pattern, the exposed surfaces of the conductive pillars being in no contact with the first support pattern, and a dielectric layer that covers the first support pattern and the capping conductive pattern, the dielectric layer being spaced apart from the conductive pillars.

According to some example embodiments, a semiconductor device may include a device isolation pattern on a substrate and defining an active section, a word line in the substrate and running across the active section, a first impurity region in the active section on one side of the word line, a second impurity region in the active section on other side of the word line, a bit line connected to the first impurity region and running across the substrate, a bottom electrode contact connected to the second impurity region, a conductive pillar on the bottom electrode contact, a support pattern in contact with a lateral surface of the conductive pillar, a capping conductive pattern that contacts an exposed surface of the conductive pillar and exposes the support pattern, the exposed surface being in no contact with the support pattern, and a dielectric layer that covers the support pattern and the capping conductive pattern, the dielectric layer being spaced apart from the conductive pillar.

According to some example embodiments, a semiconductor device may include a plurality of conductive pillars on a semiconductor substrate, a support pattern that partially contacts lateral surfaces of the conductive pillars and connects the conductive pillars to each other, the support pattern including a plurality of support holes that expose other lateral surfaces of the conductive pillars, and a capping conductive pattern that contacts exposed surfaces of the conductive pillars and exposes the support pattern, the exposed surface being in no contact with the support pattern. The capping conductive pattern may have a thickness adjacent to a region where the support pattern contacts the conductive pillar, wherein the thickness decreases as approaching the support pattern.

According to some example embodiments, a semiconductor device may include a mold layer on a substrate, a conductive pillar that penetrates the mold layer and adjoins the substrate, the conductive pillar having a hollow cup shape, a capping conductive pattern that does not contact the mold layer and contacts top, inner lateral, and inner bottom surfaces of the conductive pillar, and a dielectric layer that covers the capping conductive pattern and the mold layer, the dielectric layer being spaced apart from the conductive pillar.

According to some example embodiments, a semiconductor device may include a plurality of interlayer insulation layers that are alternately disposed on a substrate, a first conductive pattern between the interlayer insulation layer, the first conductive pattern having a hollow cylindrical shape, a capping conductive pattern that covers inner and lateral surfaces of the first conductive pattern and does not contact the interlayer insulation layers, and a dielectric layer in contact with the capping conductive pattern and the interlayer insulation layers, the dielectric layer being spaced apart from the first conductive pattern.

According to some example embodiments, a method of fabricating a semiconductor device may include sequentially forming a first mold layer and a first support layer on a substrate, forming a plurality of first conductive pillars that penetrate the first mold layer and the first support layer and adjoin the substrate, etching the first support layer to form a first support pattern including a first support hole that exposes the first mold layer, the first support pattern being in partial contact with lateral surfaces of the first conductive pillars, exposing surfaces of the first conductive pillars by removing the first mold layer through the first support hole, and forming a capping conductive pattern that selectively covers the exposed surfaces of the first conductive pillars, the exposed surfaces being in no contact with the first support pattern.

BRIEF DESCRIPTION OF THE DRAWINGS

Features will become apparent to those of skill in the art by describing in detail exemplary embodiments with reference to the attached drawings in which:

FIG. 6A illustrates a plan view of a method of fabricating a semiconductor device having the plan view of FIG. 1.

DETAILED DESCRIPTION

Figure 1:
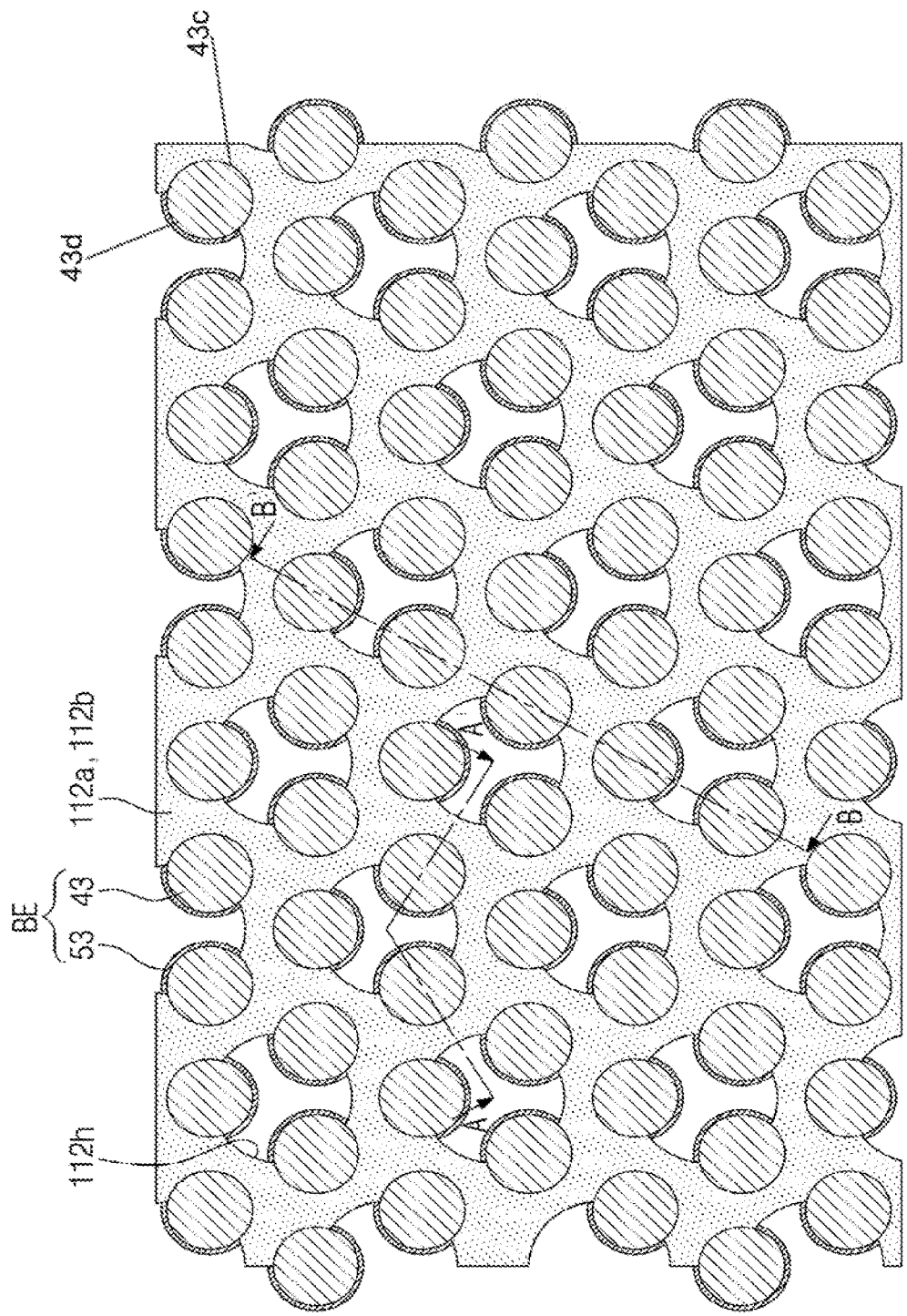
FIG. 1 illustrates a plan view of a semiconductor device according to some example embodiments.
Figure 2:
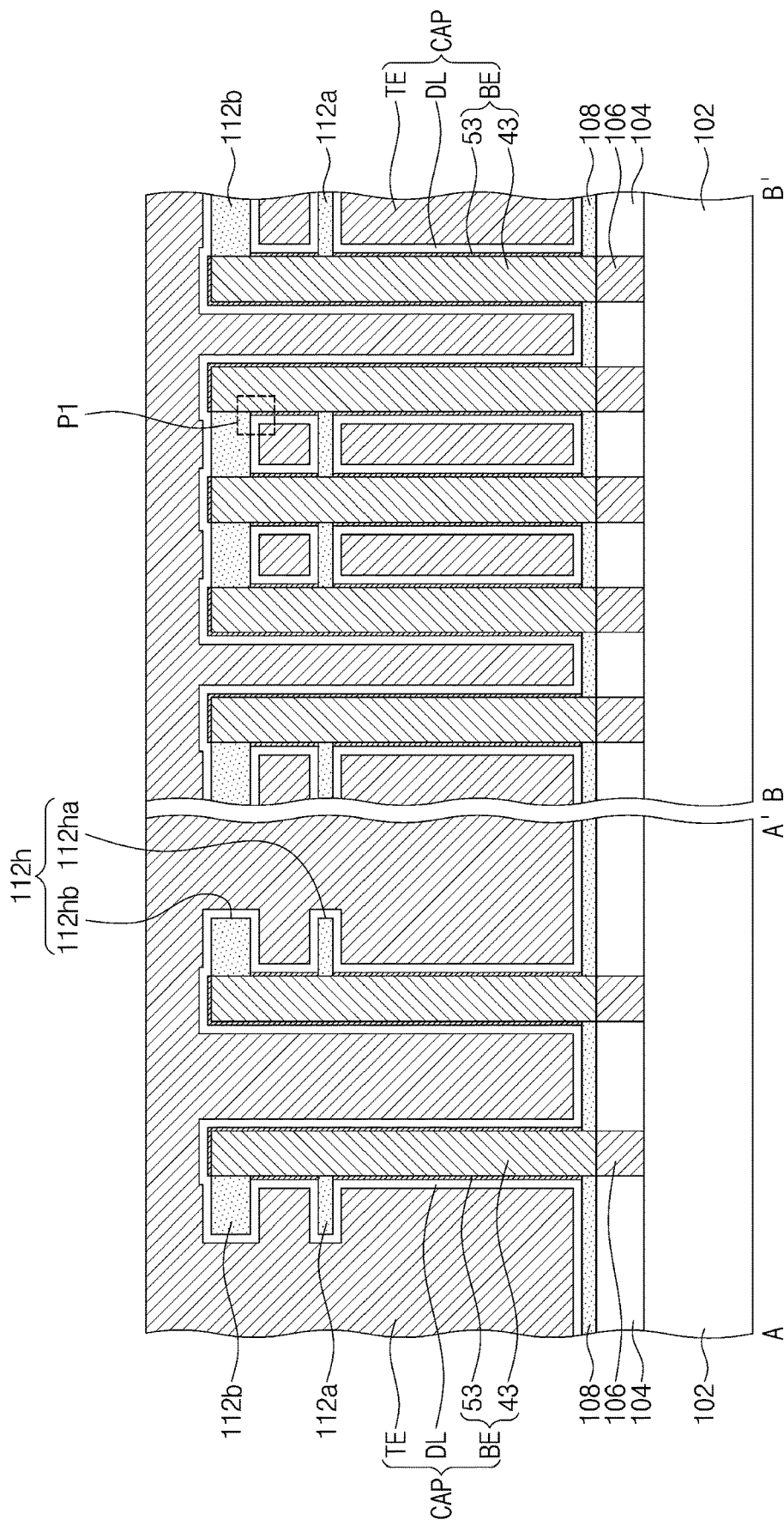
FIG. 2 illustrates a cross-sectional view along lines A-A' and B-B' of FIG. 1.
Figure 3:
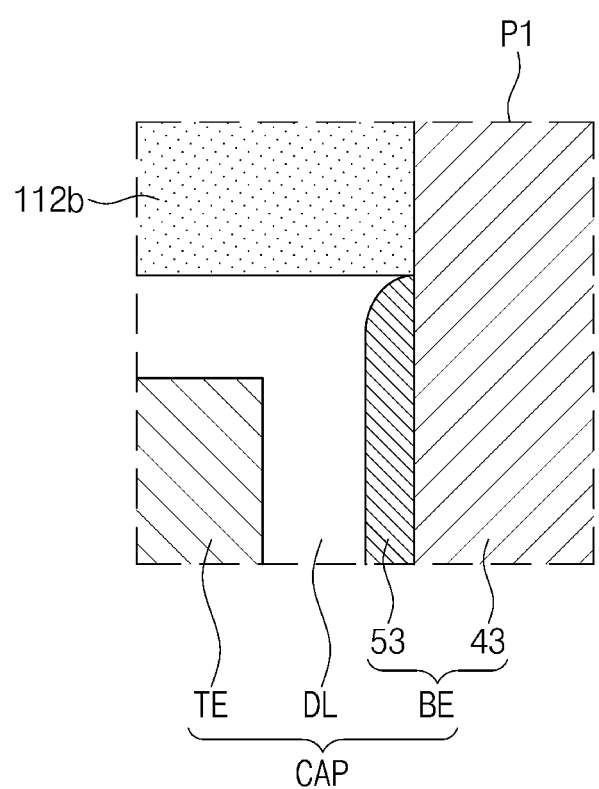
FIG. 3 illustrates an enlarged view of section P1 of FIG. 2.

FIG. 1 illustrates a plan view of a semiconductor device according to some example embodiments. FIG. 2 illustrates a cross-sectional view taken along lines A-A' and B-B' of FIG. 1. FIG. 3 illustrates an enlarged view of section P1 of FIG. 2.

Referring to FIGS. 1 to 3, a semiconductor substrate 102 may be provided. The semiconductor substrate 102 may be, e.g., a single-crystalline silicon substrate. An interlayer insulation layer 104 may be disposed on the semiconductor substrate 102. The interlayer insulation layer 104 may be formed of, e.g., a silicon oxide layer. The interlayer insulation layer 104 may have therein a plurality of bottom electrode contacts 106 that penetrate the interlayer insulation layer 104 and have electrical connection with the semiconductor substrate 102. The bottom electrode contacts 106 may include at least one of, e.g., an impurity-doped polysilicon pattern, a titanium nitride layer, and a tungsten layer.

The semiconductor substrate 102 may be provided thereon with a device isolation layer that defines active sections. A plurality of word lines may be buried in the semiconductor substrate 102. The word lines may be insulated from the semiconductor substrate 102 through a gate dielectric layer and a capping pattern. A plurality of source/drain regions may be provided to include impurity regions disposed in the semiconductor substrate 102 on opposite sides of each of the word lines. The impurity region on one side of each of the word lines may be electrically connected to a corresponding one of bit lines. The bottom electrode contact 106 may be electrically connected to the impurity region on an opposite side of each of the word lines.

An etch stop layer 108 may be disposed on the interlayer insulation layer 104. The etch stop layer 108 may be formed of a single or multiple layer(s) including at least one of, e.g., a silicon nitride layer, a silicon boron nitride (SiBN) layer, and a silicon carbon nitride (SiCN) layer. A plurality of conductive pillars 43 may penetrate the etch stop layer 108 and may contact corresponding bottom electrode contacts 106. The conductive pillars 43 may each have a circular plug shape when viewed in a plan view. The conductive pillars 43 may be arranged to constitute a honeycomb shape when viewed in a plan view. For example, six conductive pillars 43 may be disposed to constitute a hexagonal shape whose center is occupied by one conductive pillar 43. The conductive pillars 43 may include at least one of, e.g., an impurity-doped polysilicon layer, a metal layer, a metal oxide layer, and a metal nitride layer. For example, the conductive pillars 43 may include a titanium nitride layer.

The conductive pillars 43 may each have a lateral surface in contact with a first support pattern 112a and a second support pattern 112b. The first support pattern 112a and the second support pattern 112b may be spaced apart from each other, e.g., along a vertical direction perpendicular to the upper surface of the semiconductor substrate 102. The second support pattern 112b may be positioned above the first support pattern 112a. The second support pattern 112b may have a top surface substantially coplanar with those of the conductive pillars 43. The first support pattern 112a and the second support pattern 112b may be formed of a single or multiple layer(s) including at least one of, e.g., a silicon nitride (SiN) layer, a silicon boron nitride (SiBN) layer, and a silicon carbon nitride (SiCN) layer.

The first support pattern 112a and the second support pattern 112b may have different thicknesses from each other, e.g., along the vertical direction perpendicular to the upper surface of the semiconductor substrate 102. For example, the second support pattern 112b may be thicker than the first support pattern 112a. The first support pattern 112a and the second support pattern 112b may have support holes 112h. The first support pattern 112a may have a first support hole 112ha, and the second support pattern 112b may have a second support hole 112hb. The first support hole 112ha may vertically overlap the second support hole 112hb, e.g., the first and second support holes 112ha and 112hb may be aligned and completely overlap each other in the vertical direction. The support holes 112h may each expose sidewalls of three neighboring conductive pillars 43, as illustrated in FIG. 1.

The conductive pillars 43 may be covered with capping conductive patterns 53 on their surfaces, while the capping conductive patterns 53 may not contact the first and second support patterns 112a and 112b, e.g., the capping conductive patterns 53 may not contact lateral surfaces of the first and second support patterns 112a and 112b that face the conductive pillars 43. The capping conductive pattern 53 may contact lateral and top surfaces of the conductive pillar 43. The capping conductive pattern 53 may not cover but expose the first and second support patterns 112a and 112b, e.g., so the first portions 43c of the conductive pillars 43 may be in direct contact with the first and second support patterns 112a and 112b and the second portions 43d of the conductive pillars 43 may be in direct contact with the capping conductive patterns 53. In addition, the capping conductive pattern 53 may not cover but expose the etch stop layer 108. When viewed in a plan view, as shown in FIG. 1, the capping conductive pattern 53 may be exposed within the support hole 112h.

The capping conductive pattern 53 may include at least one of, e.g., a metal layer, a metal oxide layer, and a metal nitride layer. The capping conductive pattern 53 may include a different metal from that of the conductive pillars 43. The conductive pillars 43 may include a first material, and the capping conductive pattern 53 may include a second material that has a work function greater than that of the first material. The first material may have resistivity less than that of the second material. An adhesive force between the conductive pillars 43 and the first and second support patterns 112a and 112b may be greater than that between the capping conductive pattern 53 and the first and second support patterns 112a and 112b. The capping conductive pattern 53 may include at least one of, e.g., a niobium nitride (NbN) layer, a molybdenum nitride (MoN) layer, a tantalum nitride (TaN) layer, a ruthenium (Ru) layer, a platinum (Pt) layer, and an iridium (Ir) layer.

The capping conductive pattern 53 may have a thickness of about 0.3 Å to about 50 Å. The capping conductive pattern 53 may be formed to have a nearly uniform thickness. For example, as shown in FIG. 3, the capping conductive pattern 53 may have a thickness at its part adjacent to a region where the second support pattern 112b contacts the conductive pillar 43, which thickness gradually decreases as approaching the second support pattern 112b, e.g., a top edge of the capping conductive pattern 53 may have a gradually decreasing thickness toward a bottom of the second support pattern 112b. Likewise, the thickness of the capping conductive pattern 53 may gradually decrease as approaching the first support pattern 112a and the etch stop layer 108. A plurality of bottom electrodes BE may be constituted by the conductive pillars 43 and the capping conductive patterns 53 that cover surfaces of the conductive pillars 43.

The bottom electrodes BE and the first and second support patterns 112a and 112b may be covered with a dielectric layer DL having a uniform thickness. For example, the dielectric layer DL may be formed of a single or multiple layer(s) including a silicon oxide layer or a metal oxide layer, e.g., aluminum layer, whose dielectric constant is greater than that of a silicon oxide layer. The capping conductive patterns 53 may cause the dielectric layer DL to be separated and spaced from the conductive pillars 43. A top electrode TE may be disposed on the dielectric layer DL. The top electrode TE may be formed to have a single-layered or multi-layered structure including at least one of, e.g., titanium nitride layer, a tungsten layer, an impurity-doped polysilicon layer, and an impurity-doped silicon germanium layer. The bottom electrodes BE, the dielectric layer DL, and the top electrode TE may constitute a capacitor CAP.

According to some example embodiments, a semiconductor device may be configured to have the bottom electrode BE including the conductive pillar 43 and the capping conductive pattern 53 that covers entire exposed surfaces of the conductive pillar 43. The conductive pillars 43 may be covered with the capping conductive patterns 53 on their entire surfaces, with the exception of the first and second support patterns 112a and 112b, while the capping conductive patterns 53 may include a material having work function that is greater than that of the conductive pillars 43.

The work function may indicate energy, e.g., heat or light, required to externally discharge an electron from the surface of metal or semiconductor. An increase in work function may induce difficulty in externally discharging the electron from the surface, which may result in a reduction in leakage current. For example, because the bottom electrode BE is provided on its surface with the capping conductive pattern 53, which have work function that is relatively high, and because the dielectric layer DL is spaced apart from the conductive pillars 43, which have work function that is relatively low, it may be difficult for electrons to escape through the dielectric layer DL from the bottom electrode BE, with the result that leakage current may be reduced and the bottom electrode BE may favorably maintain its stored electrons or electrical information. As a result, the semiconductor device may increase in reliability. In addition, the capping conductive patterns 53 may not be connected to each other, while covering corresponding conductive pillars 43, thereby preventing electrical shorts between the bottom electrodes BE.

Moreover, the conductive pillar 43 that occupies a most part of the bottom electrode BE may have a lower resistivity than that of the capping conductive pattern 53 that occupies a relatively small part of the bottom electrode BE. Therefore, compared to a bottom electrode that is entirely formed of a capping conductive pattern, the bottom electrode BE in the present disclosure may have smaller resistance, and the semiconductor device may have increased operating speed.

Furthermore, because an adhesive force between the conductive pillar 43 and the first and second support patterns 112a and 112b is greater than that between the capping conductive pattern 53 and the first and second support patterns 112a and 112b, and because the capping conductive pattern 53 is not interposed between the conductive pillar 43 and the first and second support patterns 112a and 112b, no lamination may occur between the bottom electrode BE and the first and second support patterns 112a and 112b. Accordingly, collapse of the bottom electrode BE may be prevented to increase reliability of the semiconductor device.

Figure 4:
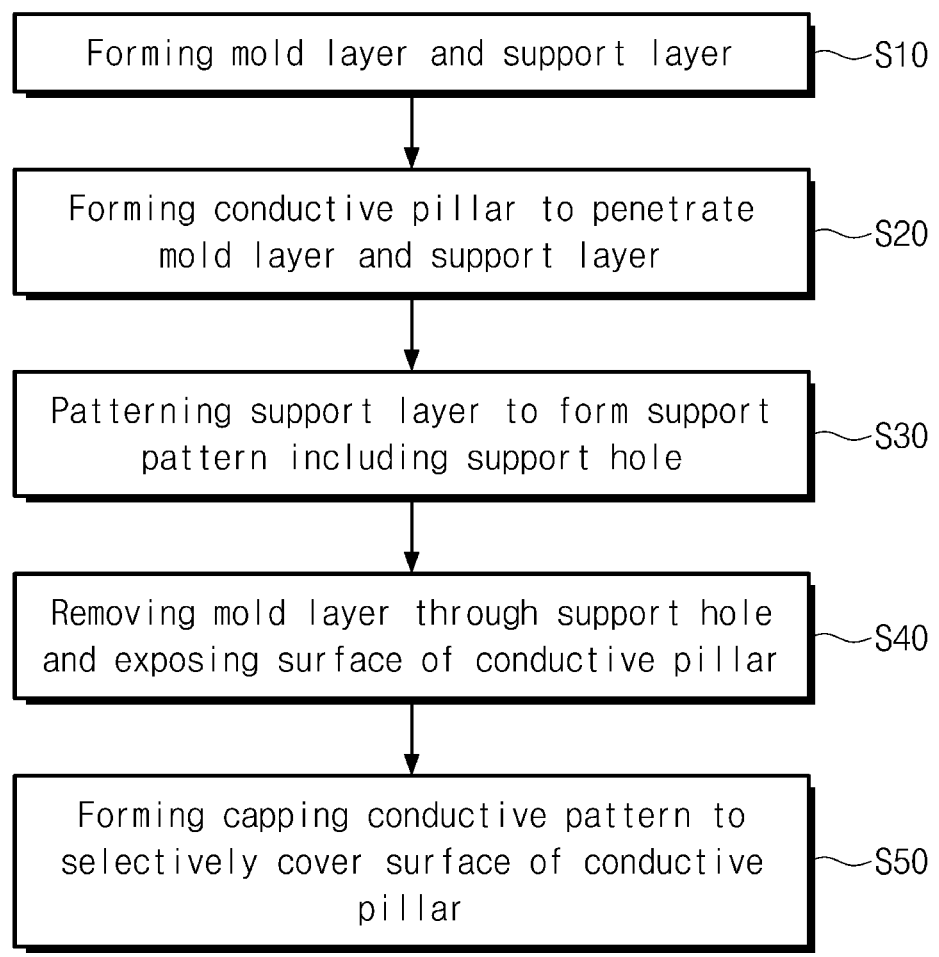
FIG. 4 illustrates a flow chart of a method of fabricating a semiconductor device according to some example embodiments.

FIG. 4 illustrates a flow chart showing a method of fabricating a semiconductor device according to some example embodiments. FIGS. 5A, 5B, 6B, and 7A to 7C illustrate cross-sectional views of stages in a method of fabricating a semiconductor device having the cross-section of FIG. 2. FIG. 6A illustrates a plan view of a method of fabricating a semiconductor device having the plan view of FIG. 1. FIG. 6B may correspond to a cross-section taken along lines A-A' and B-B' of FIG. 6A.

Figure 5A:
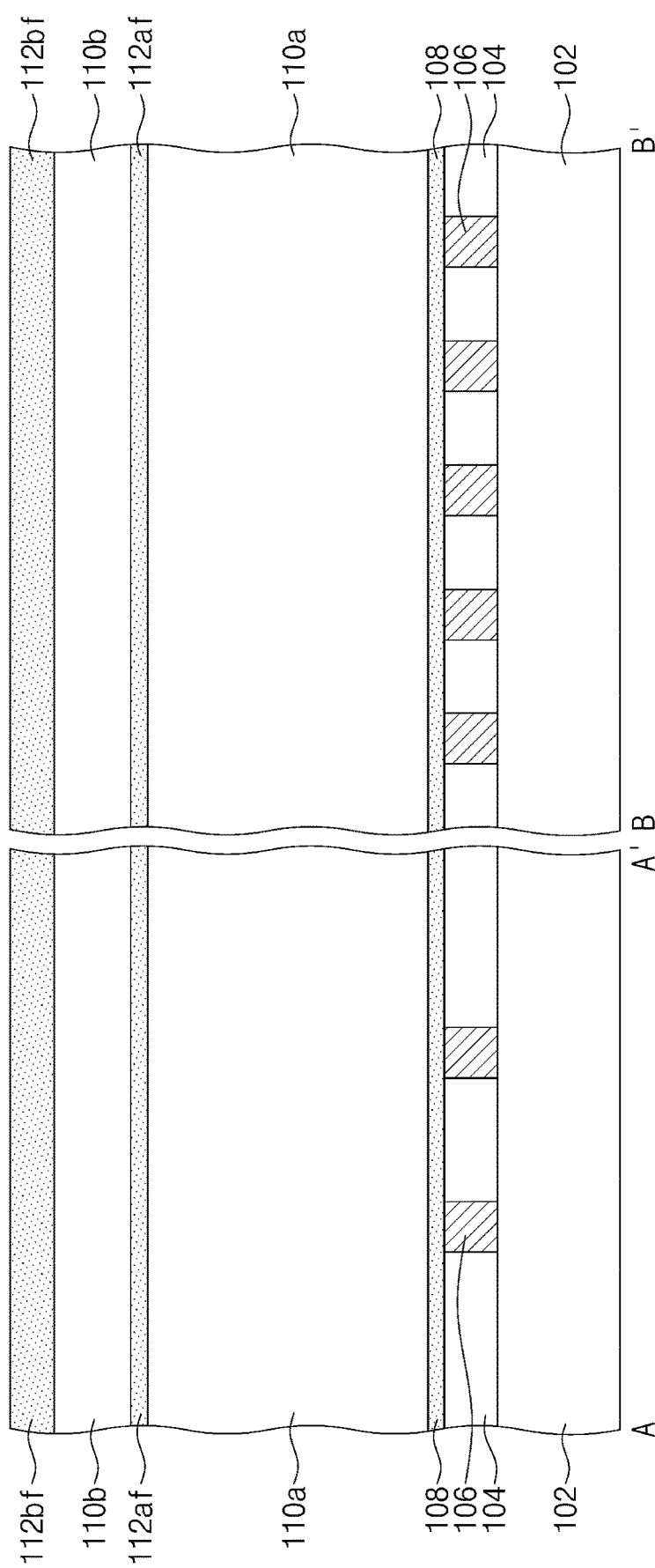
FIGS. 5A, 5B, 6B, and 7A to 7C illustrate cross-sectional views of stages in a method of fabricating a semiconductor device having the cross-section of FIG. 2.
Figure 6B:
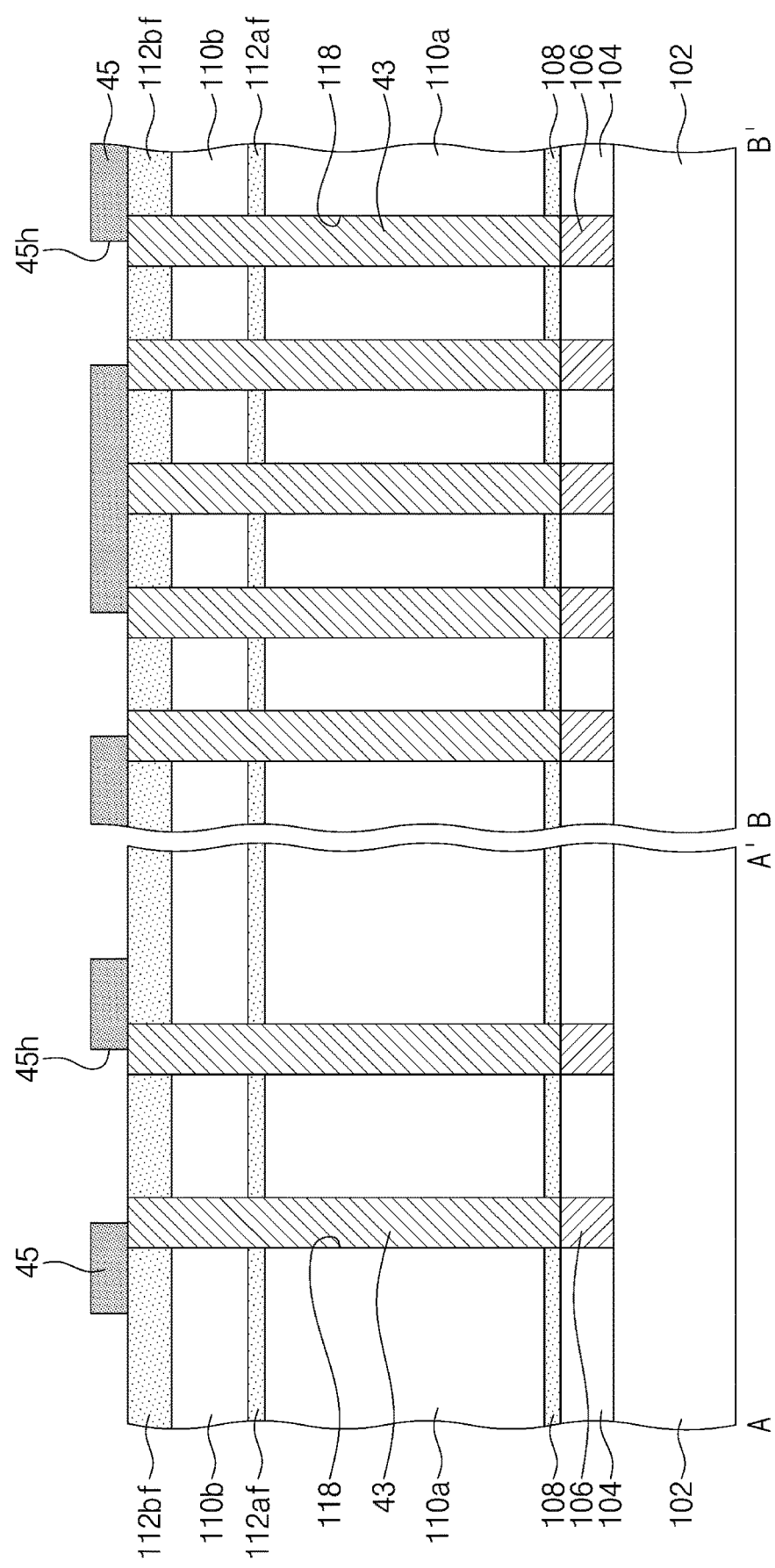

Referring to FIGS. 4 and 5A, a semiconductor device fabrication method according to embodiments may include a first operation S10 of forming a mold layer and a support layer. Before the first operation S10, the interlayer insulation layer 104 may be formed on the semiconductor substrate 102. The plurality of bottom electrode contacts 106 may be formed in the interlayer insulation layer 104. The etch stop layer 108 may be formed on the interlayer insulation layer 104 and the bottom electrode contacts 106. At the first operation S10, a mold layer 110a and 110b and a support layer 112af and 112bf may be formed on the etch stop layer 108. The operation S10 of forming the mold layer 110a and 110b and the support layer 112af and 112bf may include sequentially stacking a first mold layer 110a, a first support layer 112af, a second mold layer 110b, and a second support layer 112bf on the etch stop layer 108.

The first support layer 112af and the second support layer 112bf may be formed of the same material. The first mold layer 110a and the second mold layer 110b may include the same material, which may have an etch selectivity with respect to the first support layer 112af and the second support layer 112bf. For example, the first mold layer 110a and the second mold layer 110b may be formed of a silicon oxide layer. The first support layer 112af and the second support layer 112bf may be formed of a single or multiple layer(s) including at least one of, e.g., a silicon nitride (SiN) layer, a silicon boron nitride (SiBN) layer, and a silicon carbon nitride (SiCN) layer. The first mold layer 110a may be formed thicker than the second mold layer 110b. The second support layer 112bf may be formed thicker than the first support layer 112af.

Figure 5B:
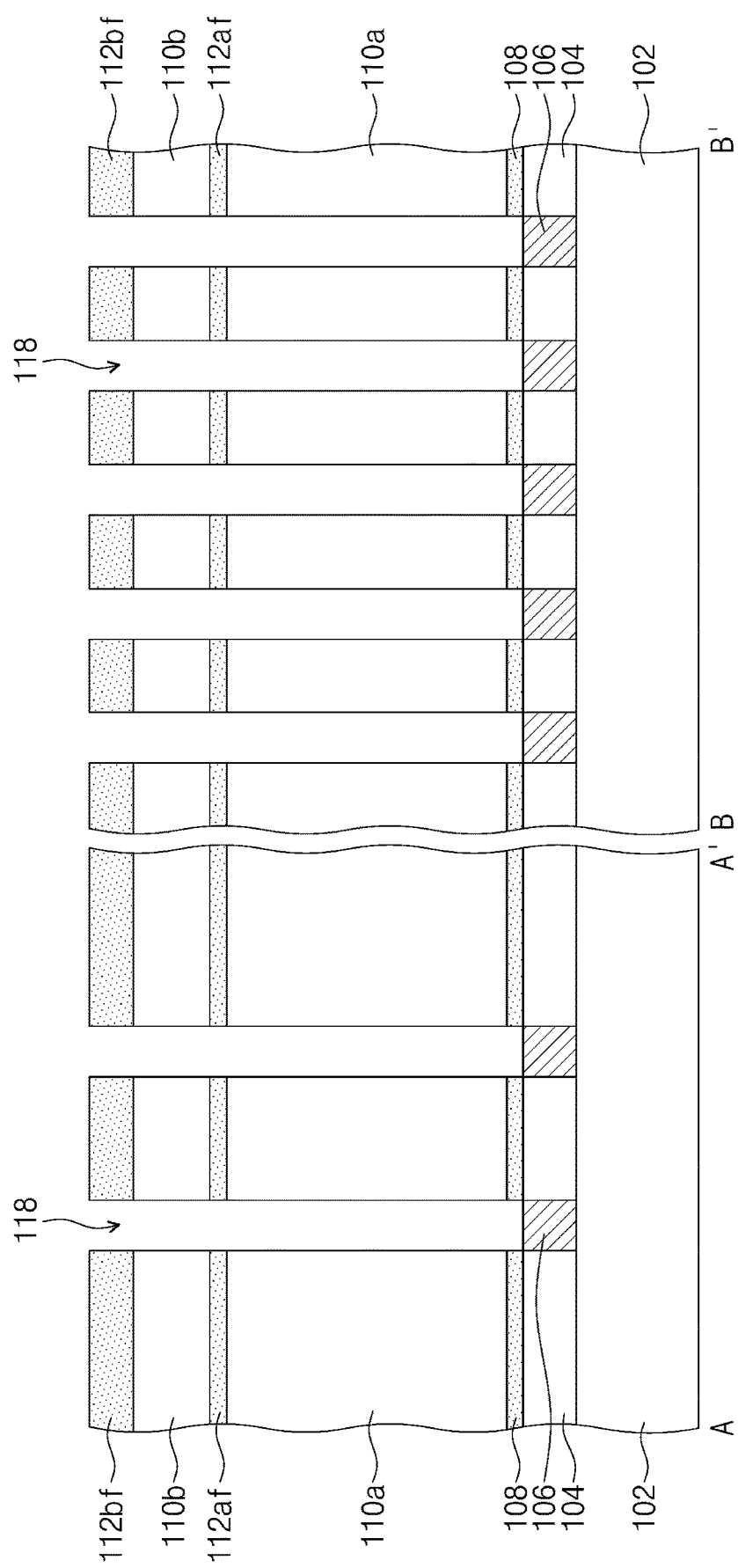

Referring to FIGS. 4, 5B, and 6B, a conductive pillar may be formed to penetrate the mold and support layers (a second operation S20). For example, as illustrated in FIG. 5B, in the second operation S20, the second support layer 112bf, the second mold layer 110b, the first support layer 112af, the first mold layer 110a, and the etch stop layer 108 may be sequentially etched to form bottom electrode holes 118 that expose corresponding bottom electrode contacts 106. Then, as illustrated in FIG. 6B, the conductive pillar 43 may be formed in the bottom electrode hole 118. For example, a conductive layer may be formed on an entire surface of the semiconductor substrate 102 to thereby fill the bottom electrode holes 118, and then the conductive layer may be etched back to form the conductive pillars 43 in corresponding bottom electrode holes 118. In addition, a top surface of the second support layer 112bf may be exposed.

Referring to FIGS. 6A and 6B, a first mask pattern 45 may be formed on the second support layer 112bf. The first mask pattern 45 may include openings 45h that partially expose top surfaces of the conductive pillars 43. For example, each of the openings 45h may partially expose the top surfaces of three neighboring conductive pillars 43 and the top surface of the second support layer 112bf between the three neighboring conductive pillars 43.

Figure 7A:
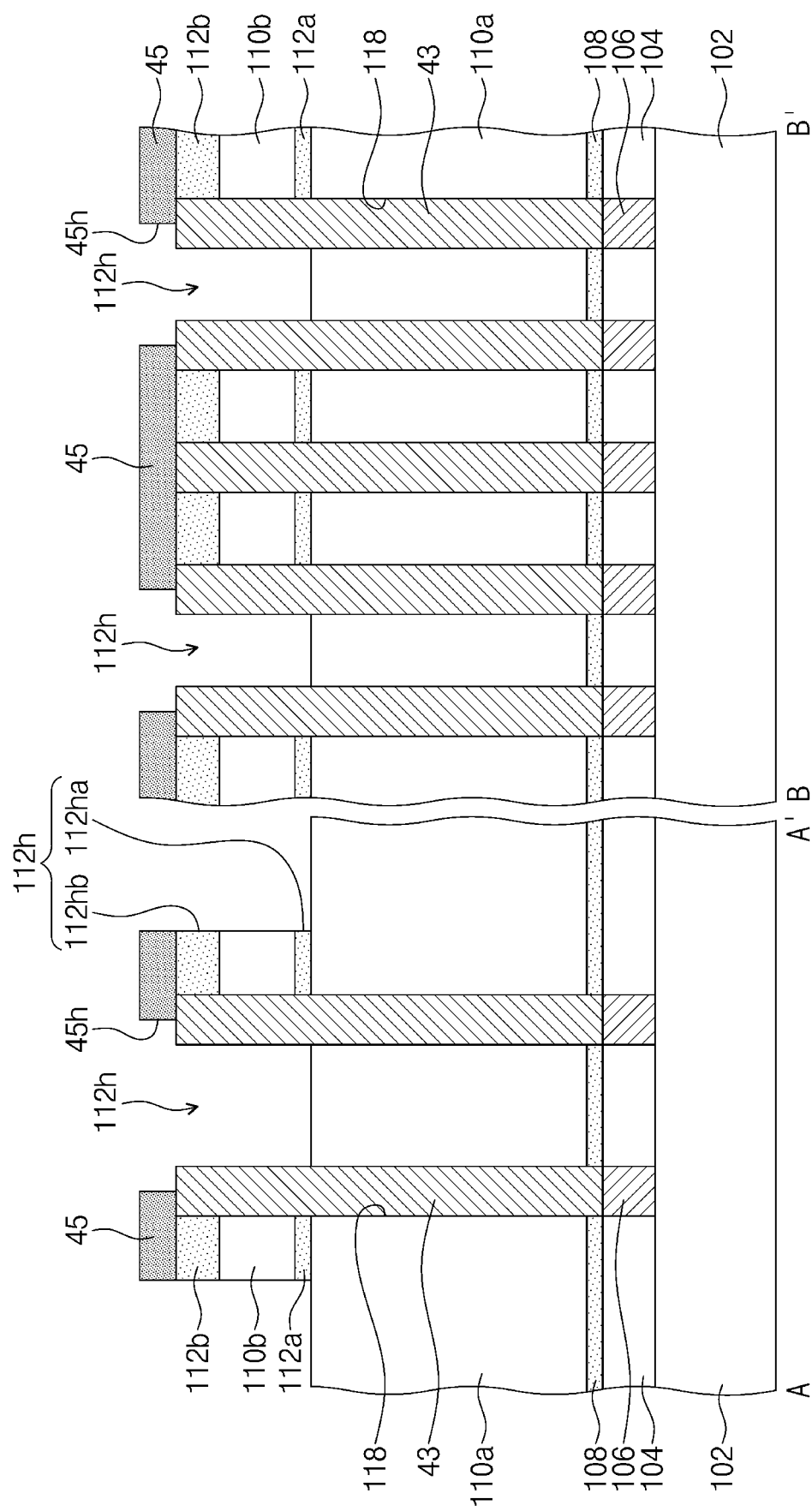

Referring to FIGS. 4 and 7A, the support layer may be patterned to form a support pattern including a support hole (a third operation S30). For example, in the third operation S30, the first mask pattern 45 may be used as an etching mask to perform an anisotropic etching process in which the second support layer 112bf exposed to the openings 45h, the second mold layer 110b below the second support layer 112bf, and the first support layer 112af below the second mold layer 110b are sequentially patterned to form the support holes 112h that expose a top surface of the first mold layer 110a. In this case, the first support layer 112af may be etched to form the first support pattern 112a that has the first support holes 112ha. In addition, the second support layer 112bf may be etched to form the second support pattern 112b that has second the support holes 112hb. The first support holes 112ha may vertically overlap corresponding second support holes 112hb and may have their shapes and sizes identical or similar to those of the second support holes 112hb. Moreover, a sidewall of the second mold layer 110b may be exposed in this case.

Figure 7B:
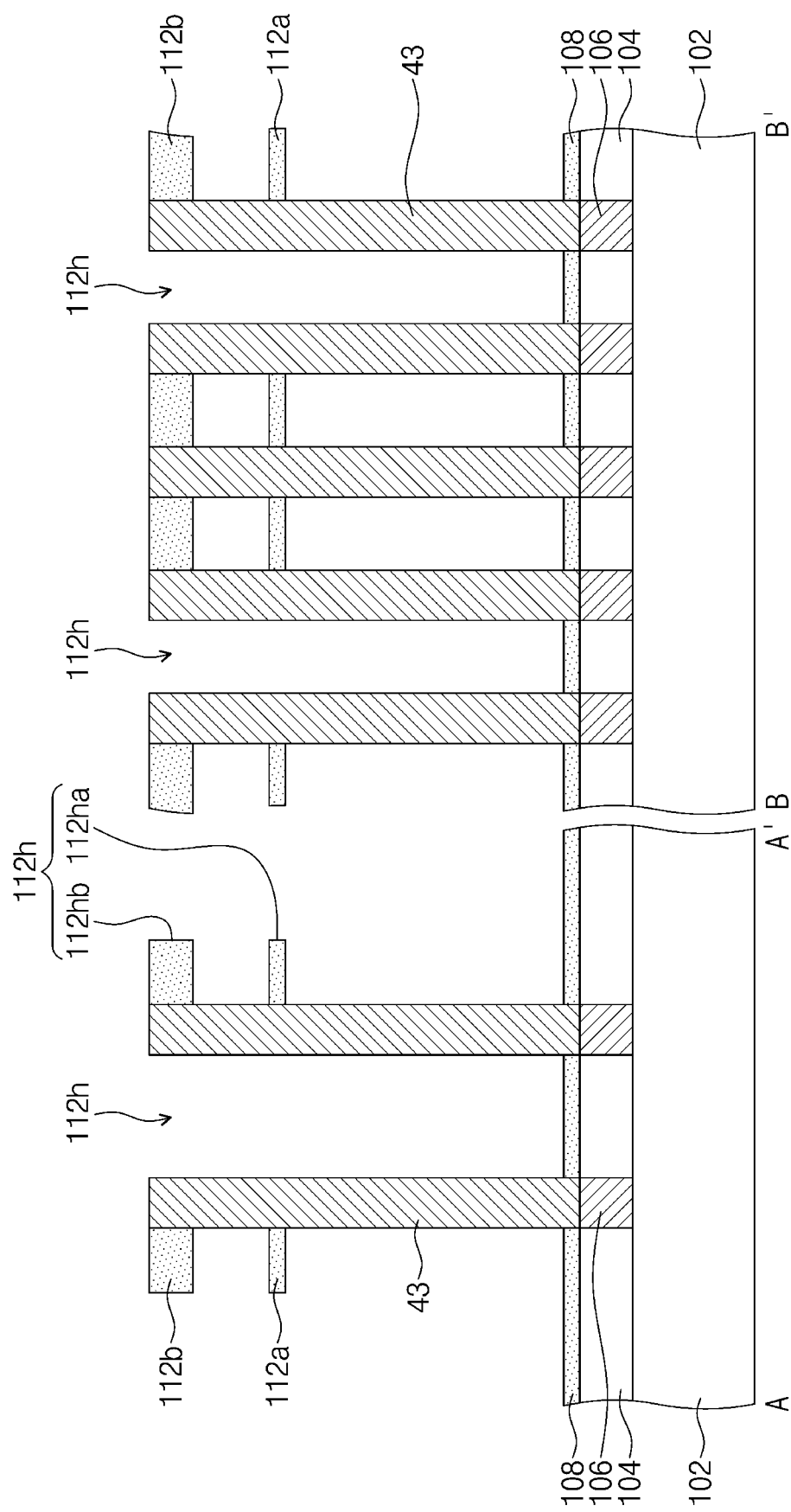

Referring to FIGS. 4 and 7B, the mold layer may be removed through the support hole and a surface of the conductive pillar may be exposed (a fourth operation S40). For example, in the fourth operation S40, an isotropic etching process may be performed in which the first and second mold layers 110a and 110b exposed to the support holes 112h are removed to expose surfaces of the conductive pillars 43. In this case, the etch stop layer 108 may be exposed at its top surface, and the first and second support patterns 112a and 112b may be exposed at their top, lateral, and bottom surfaces.

Alternatively, an anisotropic etching process may be performed in which the second support layer 112bf is etched to form the second support pattern 112b including the second support hole 112hb, and then an isotropic etching process may be performed to remove the second mold layer 110b through the second support holes 112hb. Thereafter, an anisotropic etching process may be performed in which the first support layer 112af is etched to form the first support pattern 112a including the first support hole 112ha, and then an isotropic etching process may be performed to remove the first mold layer 110a through the first support hole 112ha.

Figure 7C:
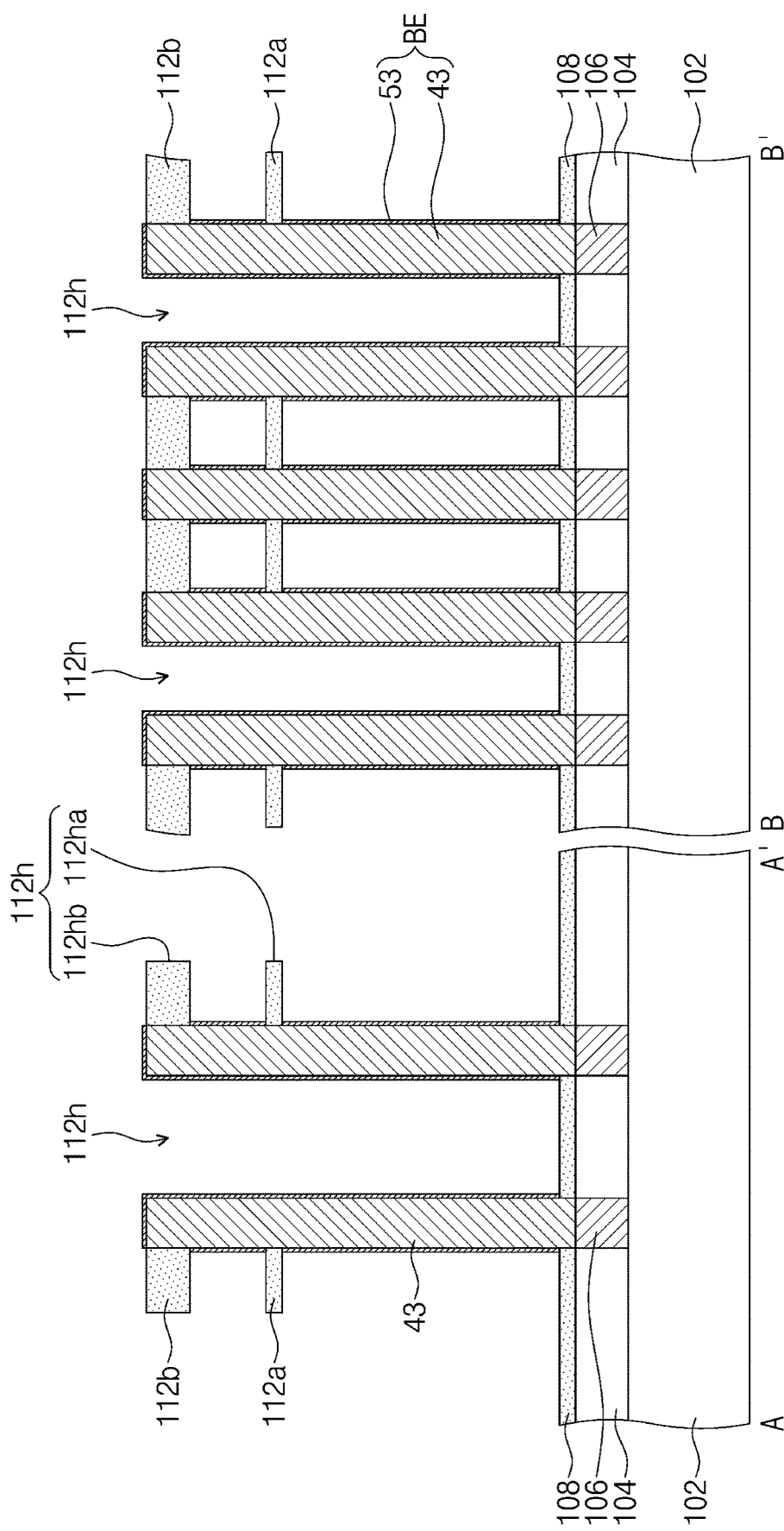

Referring to FIGS. 4 and 7C, a capping conductive pattern may be formed to selectively cover the surface of the conductive pillar (a fifth operation S50). An area selective deposition (ASD) process may be performed in the fifth operation S50. In the area selective deposition process, a specific metal precursor may be used which has no or relatively low chemical affinity to surfaces of the etch stop layer 108, the first support pattern 112a, and the second support pattern 112b, but which has a relatively high chemical affinity to the surfaces of the conductive pillars 43. The conductive pillars 43 may have a different material from those of the etch stop layer 108, the first support pattern 112a, and the second support pattern 112b, and thus may have different surface chemical characteristics from those of the etch stop layer 108, the first support pattern 112a, and the second support pattern 112b. Accordingly, a metal precursor may be used whose chemical affinity is different based on the difference in chemical characteristics.

For example, the metal precursor may have the following structure.

$$ML_n \qquad \text{<Chemical Formula 1>}$$

In Chemical Formula 1, M may symbolize a metal element, L may signify a ligand combined with the metal element, and n may express the number of ligands. The n may range from 2 to 6. The M may include a d-orbital and/or an f-orbital in the periodic table of elements. The metal M may be positioned at a center of the metal precursor. The M may be, e.g., a transition metal. As one detailed example, the M may be niobium (Nb), molybdenum (Mo), tantalum (Ta), ruthenium (Ru), tungsten (W), platinum (Pt), or iridium (Ir). At least one of the ligands L may be an anionic ligand or a neutral ligand.

For example, the anionic ligand may include (or when the anionic ligand is provided in plural, the anionic ligands may respectively independently include) one of hydrogen (H), fluorine (F), chlorine (Cl), bromine (Br), iodine (I), C1 to C10 alkoxy groups, C6 to C12 aryl groups, C3 to C15 allyl groups, C4 to C15 dienyl groups, C5 to C12 cyclopentadienyl groups, C5 to C20 β-diketonato groups, C5 to C20 β-ketoiminato groups, C5 to C20 β-diiminato groups, hydroxyl (OH) groups, amido ($NH_2$) groups, C1 to C10 amido groups, C1 to C10 imido groups, C1 to C10 carboxyl groups, C1 to C10 amidine groups, C1 to C10 acetamido groups, and C1 to C10 thiol groups.

For example, the neutral ligand may include (or when the neutral ligand is provided in plural, the neutral ligands may respectively independently include) one of C2 to C10 alkene, C2 to C10 alkyne, C1 to C10 alcohol, C2 to C10 ether compounds, C3 to C10 ketone compounds, C6 to C12 aryl compounds, C3 to C15 allyl compounds, C4 to C15 diene compounds, C5 to C20 β-diketone compounds, C6 to C12 β-ketoimine compounds, C5 to C20 β-diimine compounds, ammonia, C1 to C10 amine compounds, C1 to C10 thiol compounds, C2 to C10 thioether compounds, and C2 to C10 thioketone compounds.

The ligands L combined with the M may have a size greater than that of the metal element. The ligands may be multidentate. Therefore, steric hindrance may be induced to prevent the M from depositing on the surfaces of the first and second support patterns 112a and 112b and the etch stop layer 108 that are formed of a silicon nitride layer.

At least one of the ligands L may be different from others. At least one of the ligands L may include nitrogen or oxygen. For example, the ligands L may independently include hydrogen, an alkyl group, an alkenyl group, an alkynyl group, a halogen element, a cyclopentadienyl group, an amino group, an imino group, or an alkoxy group. The halogen element may be, e.g., chlorine.

About 14 to 18 electrons may be present around the metal M. For example, when the metal is niobium, five valence electrons may be present, and a cyclopentadienyl group of the ligands may provide five electrons to combine with niobium. A halogen element and an alkoxy group may each provide one electron to combine with niobium. An imino group may provide two electrons to combine with niobium. As discussed above, the metal and the ligands may be selected to satisfy that the metal precursor has 14 to 18 electrons as a sum of the number of valence electrons of the metal and the number of electrons of the ligands.

The area selective deposition process may be performed in such a way that a plurality of process cycles is repeatedly executed. A single process cycle may include proving the metal precursor as a source gas to adsorb the metal precursor only on the surfaces of the conductive pillars 43, purging the source gas not adsorbed on the surfaces of the conductive pillars 43, providing a reaction gas combined with the ligands to separate the ligands from the metal element and to form a single-atom metal layer, and purging either the reaction gas not combined with the ligands or a produced gas combined with the ligands.

Accordingly, no metal precursor may be deposited on the surfaces of the etch stop layer 108, the first support pattern 112a, and the second support pattern 112b, but the metal precursor may be deposited only on the surface of the conductive pillar 43 to form the capping conductive pattern 53. The capping conductive pattern 53 may contact lateral and top surfaces of the conductive pillar 43, which lateral and top surfaces are in no contact with, e.g., lateral surfaces of, the first and second support patterns 112a and 112b. For example, as illustrated in FIG. 2, the capping conductive pattern 53 may not extend along an interface between the conductive pillar 43 and each of the first and second support patterns 112a and 112b, e.g., the capping conductive pattern 53 may include openings exposing portions of the conductive pillar 43 that directly contact the first and second support patterns 112a and 112b. The capping conductive pattern 53 may not cover but expose the first and second support patterns 112a and 112b. In addition, the capping conductive pattern 53 may not cover but expose the etch stop layer 108. Because no or almost no metal precursor is deposited on the surfaces of the etch stop layer 108, the first support pattern 112a, and the second support pattern 112b, as shown in FIG. 3, the capping conductive pattern 53 may have a relatively small thickness adjacent to the surfaces of the etch stop layer 108, the first support pattern 112a, and the second support pattern 112b. The capping conductive pattern 53 and the conductive pillar 43 may constitute the bottom electrode BE.

Subsequently, referring to FIG. 2, the dielectric layer DL may be formed to have a uniform thickness on the entire surface of the semiconductor substrate 102. Further, the top electrode TE may be formed on the dielectric layer DL.

The following will discuss an experimental example of the area selective deposition process according to embodiments.

Three test wafers were prepared in the experimental example. A titanium nitride (TiN) layer was deposited on a first test wafer. A silicon nitride (SiN) layer was deposited on a second test wafer. A silicon (Si) layer was deposited on a third test wafer. Each of the test wafers was provided with a metal precursor to perform a deposition process. Niobium (Nb) was included to occupy a center of the metal precursor, and nitrogen was included in at least one ligand. The metal precursor was under other conditions the same as those discussed above. An experiment was executed in which the metal precursor was provided to deposit a niobium nitride (NbN) layer on each of the test wafers. A graph shown in FIG. 8 was obtained as a result of the experimental example.

Figure 8:
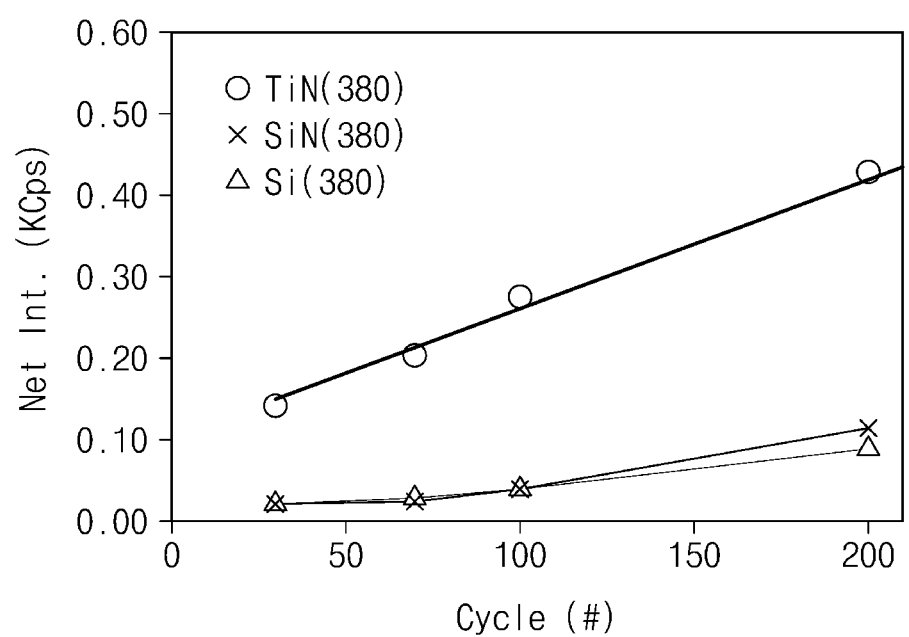
FIG. 8 illustrates a graph of a result of an experimental example according to embodiments.

FIG. 8 illustrates a graph showing a result of the experimental example according to embodiments.

Referring to FIG. 8, the horizontal axis indicates the number of cycles of deposition process, and the vertical axis denotes intensity of a metal element obtained when X-ray fluorescence (XRF) is used. The intensity of a metal element may be proportional to a deposition thickness of a metal layer. As shown in FIG. 8, niobium on the titanium nitride (TiN) layer may exhibit intensity that increases in proportion to the number of cycles of deposition process. It may however be ascertained that, on the silicon nitride layer or the silicon layer, the intensity of niobium reaches nearly 0.00 when the number of cycles is about 70 or less, but slightly increases when the number of cycles is greater than about 70. It may be found that the intensity of niobium is relatively less on the silicon nitride layer or the silicon layer than on the titanium nitride layer. Accordingly, when the number of cycles of deposition process is adjusted to about 70 or less, the niobium nitride layer may be deposited only on the titanium nitride layer.

In embodiments, as discussed above, the area selective deposition process may be used to selectively form the capping conductive pattern 53 only on the surface of the conductive pillar 43. Therefore, it may not be required to additionally perform a process that removes the capping conductive pattern 53 formed on unwanted regions (or, the surfaces of the etch stop layer 108, the first support pattern 112a, and the second support pattern 112b) so as to prevent an electrical short between the bottom electrodes BE. Accordingly, it may be possible to simplify processes and to increase process yield.

Figure 9:
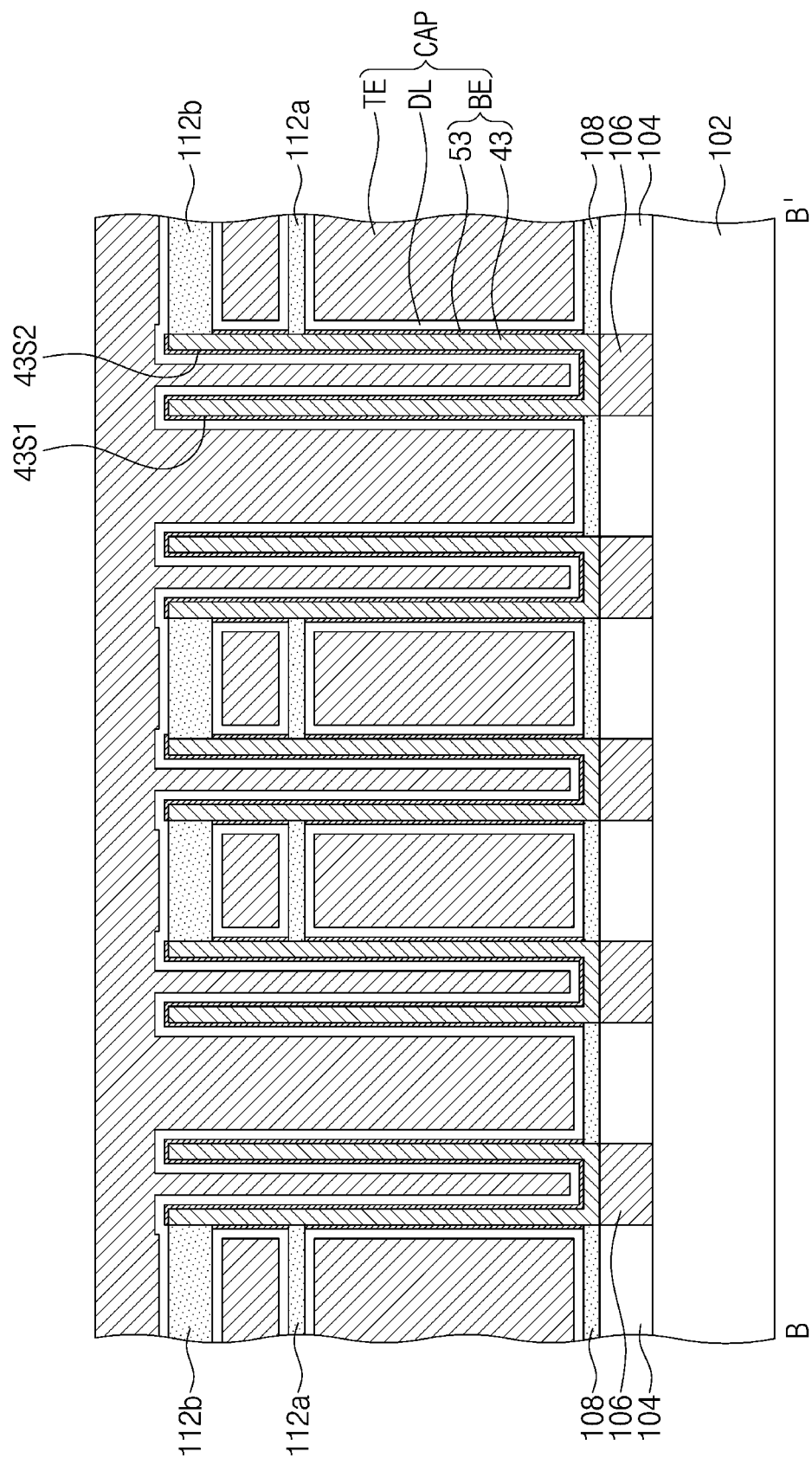
FIG. 9 illustrates a cross-sectional view along line B-B' of FIG. 1.

FIG. 9 illustrates a cross-sectional view taken along line B-B' of FIG. 1.

Referring to FIG. 9, according to some example embodiments, a semiconductor device may include the conductive pillars 43 each of which has a hollow cup or cylindrical shape. The capping conductive pattern 53 may extend to cover both an outer sidewall 43S1 and an inner sidewall 43S2 of the conductive pillar 43. The dielectric layer DL may also extend to cover the inner sidewall 43S2 of the conductive pillar 43. A portion of the top electrode BE may extend into the conductive pillar 43. Other configurations may be identical or similar to those discussed with reference to FIGS. 1 to 3.

Figure 10:
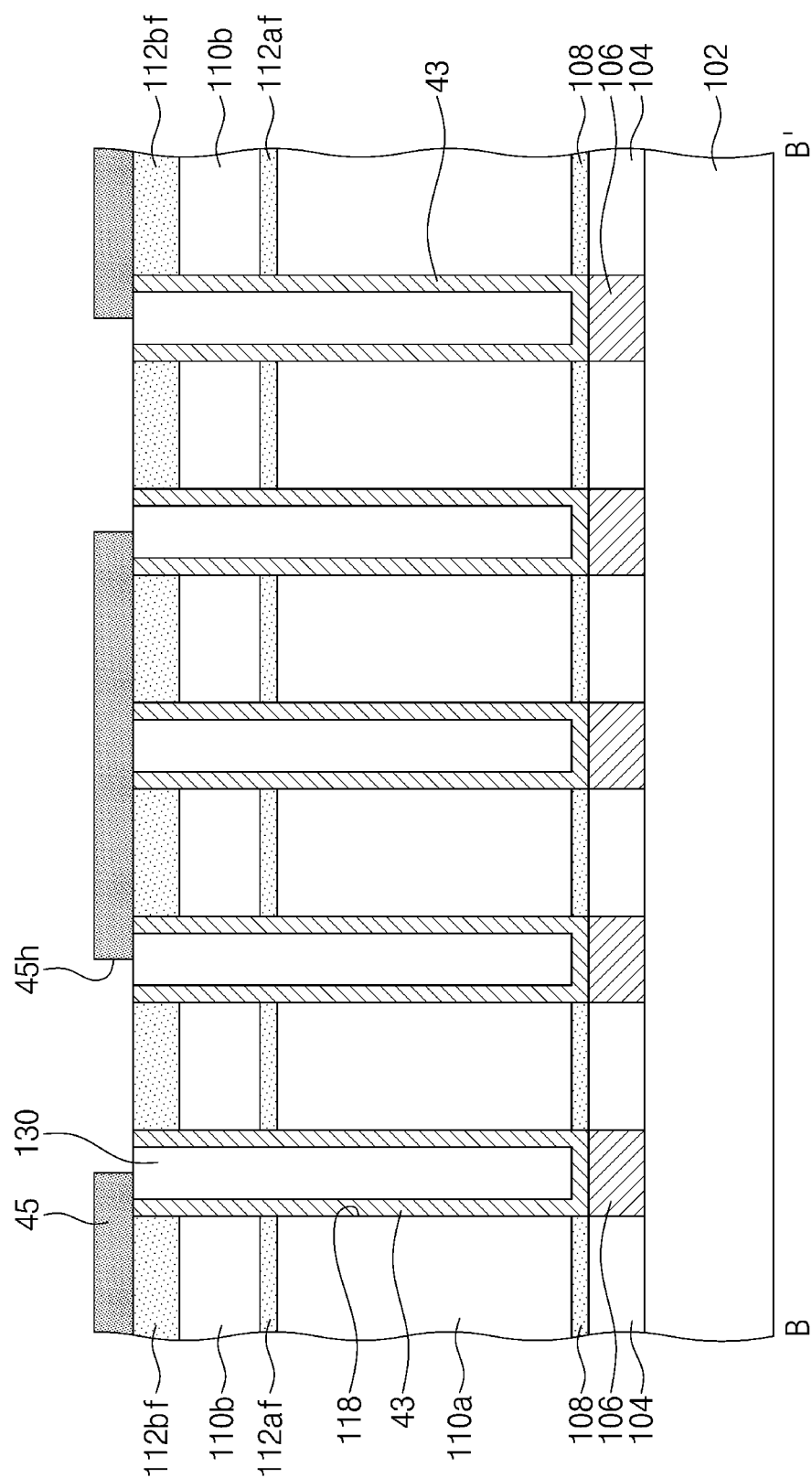
FIG. 10 illustrates a cross-sectional view of a method of fabricating the semiconductor device of FIG. 9.

FIG. 10 illustrates a cross-sectional view showing a stage in a method of fabricating the semiconductor device of FIG. 9.

Referring to FIG. 10, at the stage shown in FIG. 5B, the semiconductor substrate 102 may be provided thereon with a conductive layer that is formed to have a uniform thickness to cover bottom and lateral surfaces of the bottom electrode holes 118. In this case, the conductive layer may be formed to have a relatively small thickness that is insufficient enough to fill the bottom electrode holes 118. A sacrificial layer 130 may be formed on the conductive layer, thereby filling the bottom electrode holes 118. The sacrificial layer 130 and the conductive layer may undergo an etch-back process or a chemical mechanical polishing (CMP) process to expose the top surface of the second support layer 112bf and to leave the conductive pillars 43 and the sacrificial layer 130 in the bottom electrode holes 118. Thereafter, subsequent processes may be performed as discussed with reference to FIGS. 6A through 7C. At the stage shown in FIG. 7B, the sacrificial layer 130 may be removed when the mold layers 110a and 110b are removed, such that the inner sidewalls (see 43S2 of FIG. 9) of the conductive pillars 43 may be exposed. Therefore, at the stage shown in FIG. 7C, the capping conductive pattern 53 may also be deposited on the inner sidewall 43S2 of the conductive pillar 43. Other processes may be identical or similar to those discussed above.

Figure 11:
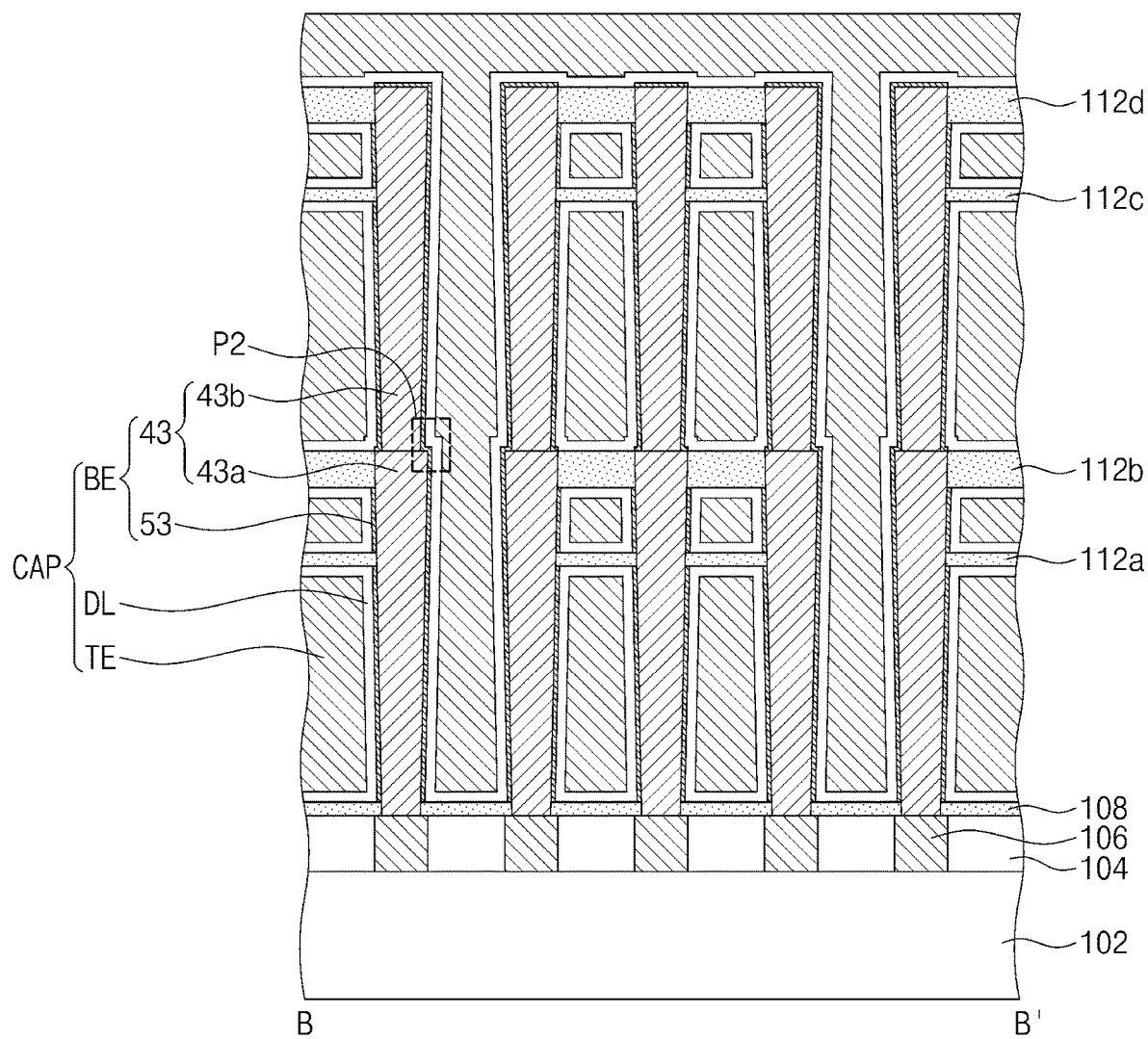
FIG. 11 illustrates a cross-sectional view along line B-B' of FIG. 1.
Figure 12:
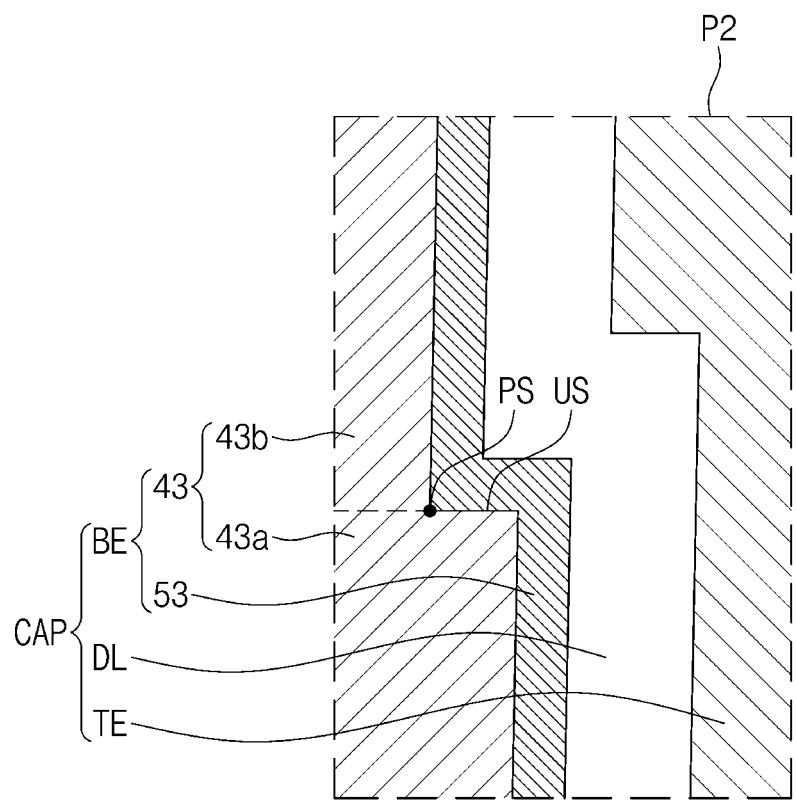
FIG. 12 illustrates an enlarged view of section P2 of FIG. 11.

FIG. 11 illustrates a cross-sectional view taken along line B-B' of FIG. 1. FIG. 12 illustrates an enlarged view showing section P2 of FIG. 11.

Referring to FIGS. 11 and 12, each of the conductive pillars 43 may include a lower pillar 43a and an upper pillar 43b disposed on the lower pillar 43a. A boundary may be present or absent between the lower pillar 43a and the upper pillar 43b. The lower pillar 43a and the upper pillar 43b may each have an inclined sidewall. The conductive pillars 43 may have their sidewalls each of which has an inflection point PS between the lower pillar 43a and the upper pillar 43b. An upper portion of the lower pillar 43a may be wider than a lower portion of the upper pillar 43b. The lower pillar 43a may have a top surface US that is partially exposed. The capping conductive pattern 53 may cover the exposed top surface US of the lower pillar 43a. The lower pillar 43a may have a sidewall in contact with the first and second support patterns 112a and 112b that are spaced apart from each other. The upper pillar 43b may have a sidewall in contact with third and fourth support patterns 112c and 112d that are spaced apart from each other. The capping conductive pattern 53 may cover none of the first, second, third, and fourth support patterns 112a, 112b, 112c, and 112d. The dielectric layer DL may extend to contact the third and fourth support patterns 112c and 112d. Other configurations may be identical or similar to those discussed with reference to FIGS. 1 to 3.

Figure 13A:
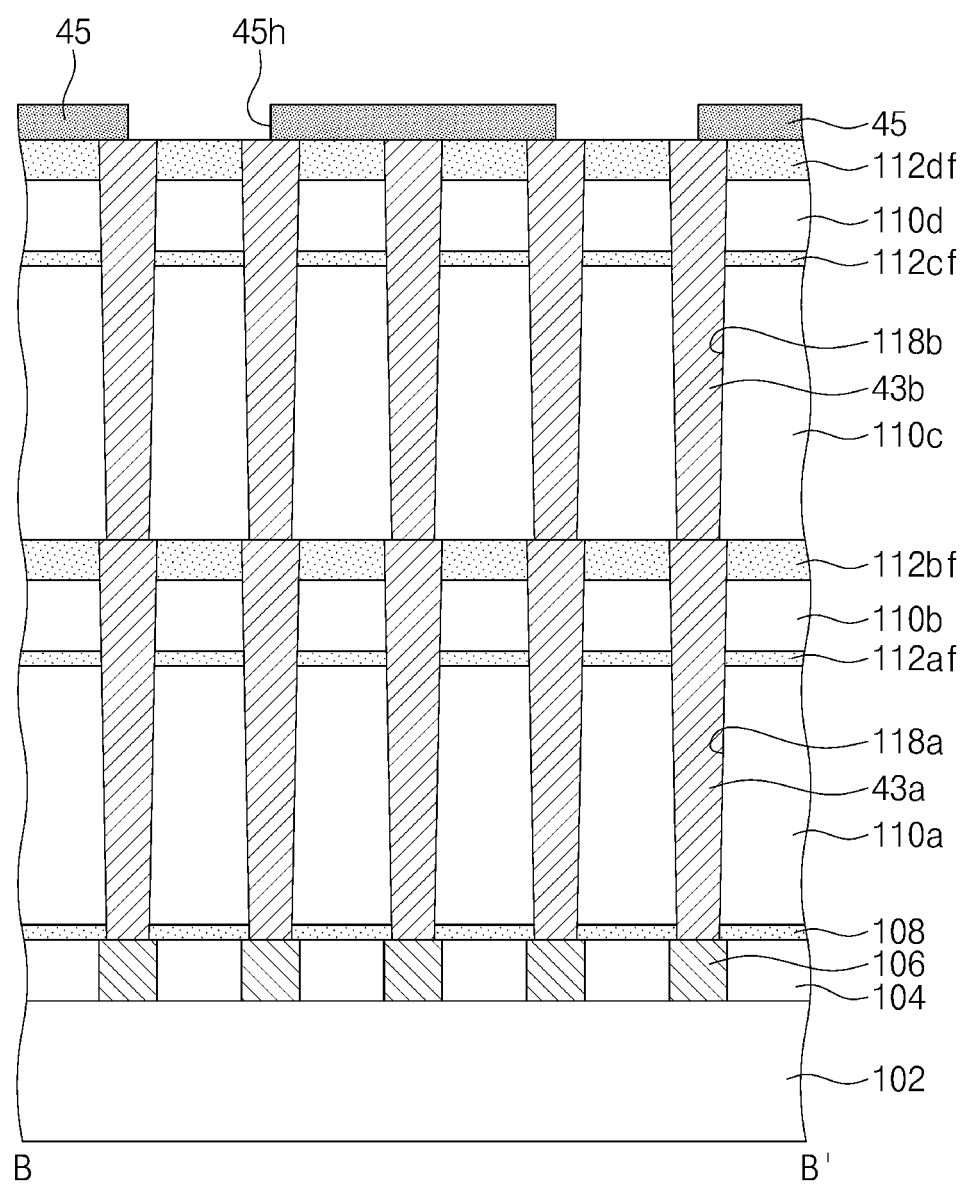
FIGS. 13A to 13C illustrate cross-sectional views of stages in a method of fabricating the semiconductor device of FIG. 11.
Figure 13B:
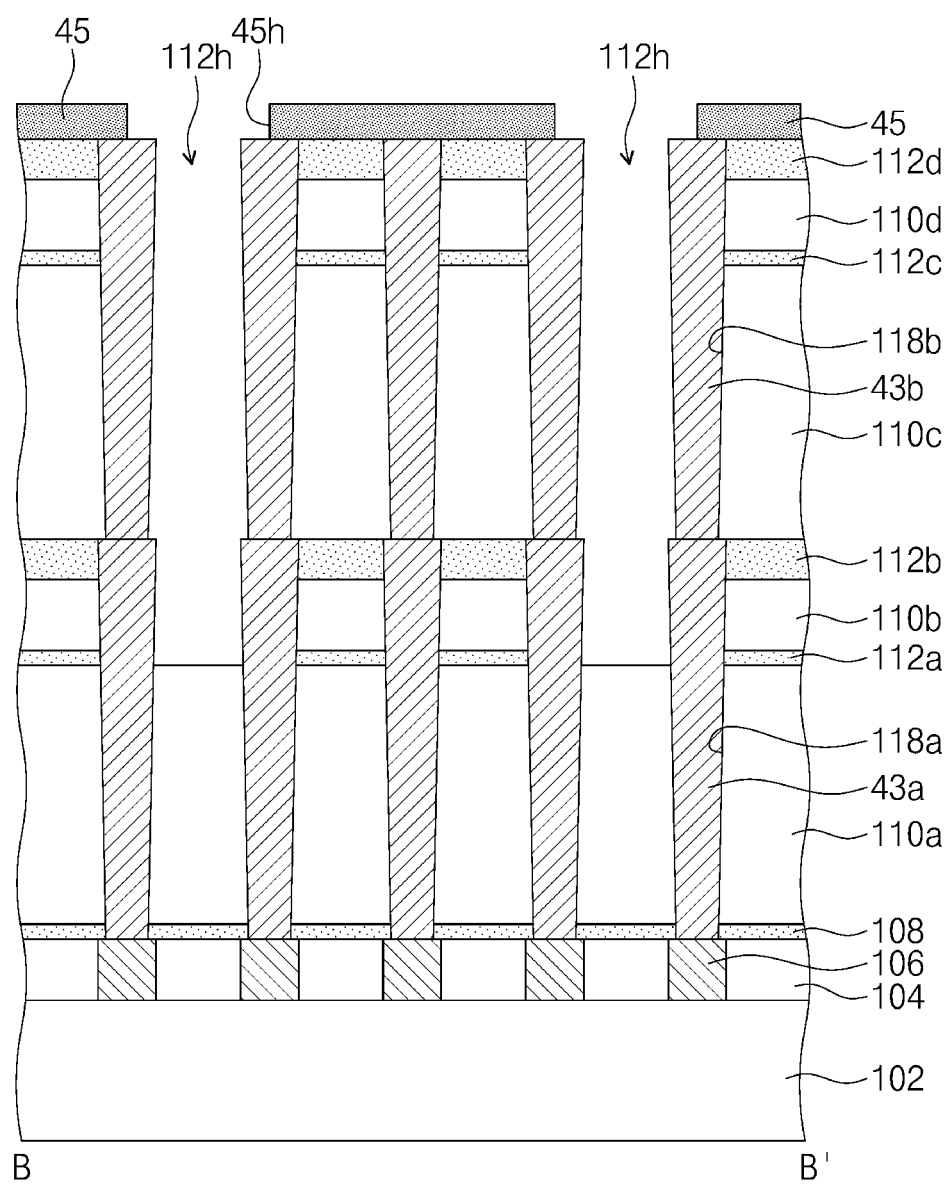
Figure 13C:
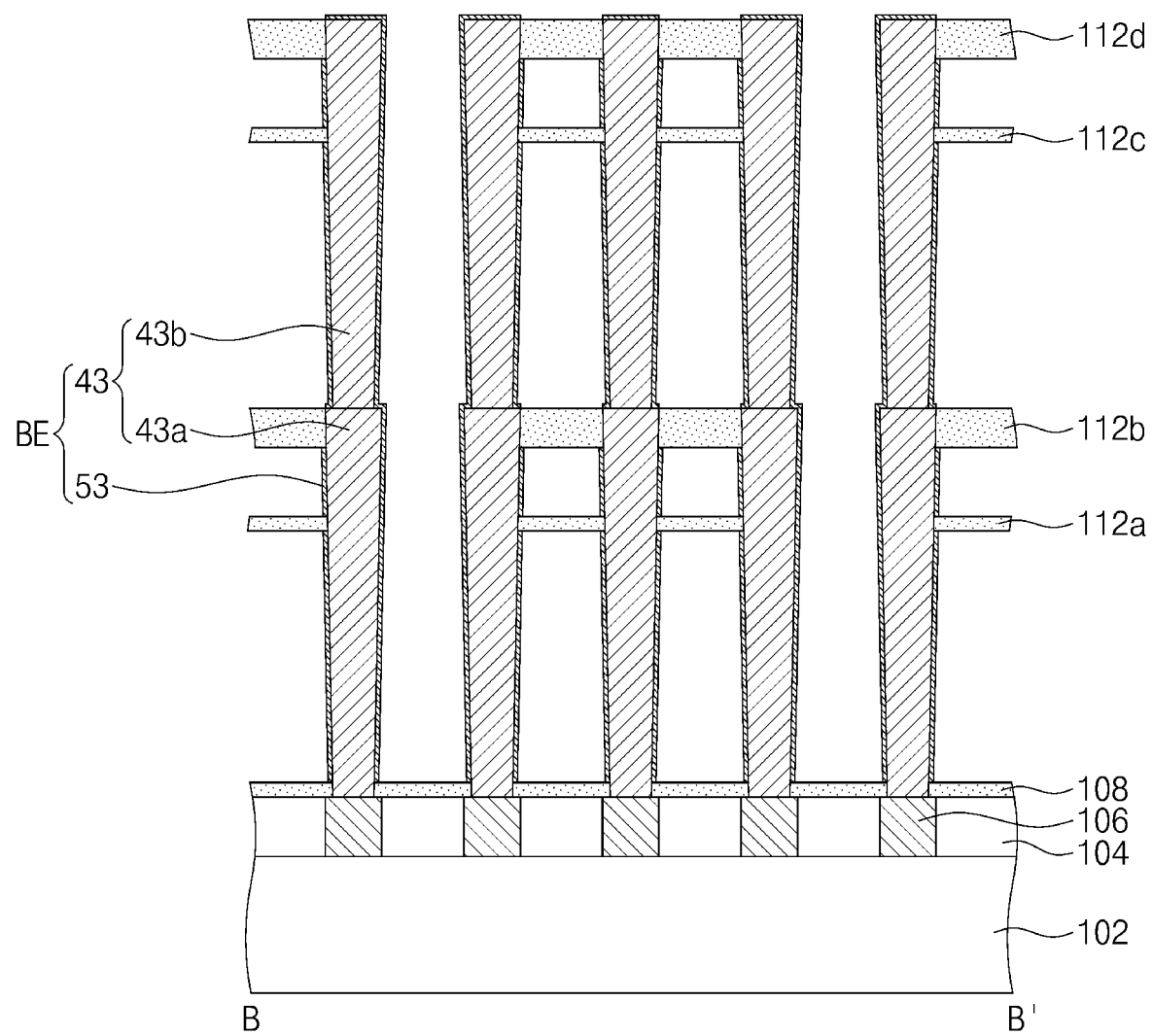

FIGS. 13A to 13C illustrate cross-sectional views of stages in a method of fabricating the semiconductor device of FIG. 11.

Referring to FIG. 13A, the first mold layer 110a, the first support layer 112af, the second mold layer 110b, and the second support layer 112bf may be sequentially formed on the etch stop layer 108. The second support layer 112bf, the second mold layer 110b, the first support layer 112af, the first mold layer 110a, and the etch stop layer 108 may undergo an etching process to from a lower hole 118a that exposes the bottom electrode contact 106. The lower pillar 43a may be formed in the lower hole 118a. A third mold layer 110c, a third support layer 112cf, a fourth mold layer 110d, and a fourth support layer 112df may be sequentially formed on the second support layer 112bf, and then may undergo an etching process to form an upper hole 118b that exposes the lower pillar 43a. The upper pillar 43b may be formed in the upper hole 118b. The lower hole 118a and the upper hole 118b may be formed to have their inclined inner sidewalls when the etching processes are performed to form the lower hole 118a and the upper hole 118b. The first mask pattern 45 having the openings 45h may be formed on the fourth support layer 112df.

Referring to FIG. 13B, the first mask pattern 45 may be used as an etching mask to perform an anisotropic etching process in which the fourth support layer 112df, the fourth mold layer 110d, the third support layer 112cf, the third mold layer 110c, the second support layer 112bf, the second mold layer 110b, and the first support layer 112af are sequentially etched to form the support holes 112h that expose the first mold layer 110a and to form first, second, third, and fourth support patterns 112a, 112b, 112c, and 112d.

Referring to FIG. 13C, the first, second, third, and fourth mold layers 110a, 110b, 110c, and 110d may be removed through the support holes 112h, and the lower and upper pillars 43a and 43b may be exposed at surfaces thereof. The area selective deposition process may be performed to form the capping conductive pattern 53 on the surfaces of the lower and upper pillars 43a and 43b. Other processes may be identical or similar to those discussed above.

Alternatively, an anisotropic etching process and an isotropic etching process may be alternately and repeatedly performed to etch the first, second, third, and fourth support layers 112af, 112bf, 112cf, and 112df and the first, second, third, and fourth mold layers 110a, 110b, 110c, and 110d. For example, an anisotropic etching process may be performed to form the fourth support pattern 112d, an isotropic etching process may be performed to remove the fourth mold layer 110d, an anisotropic etching process may be performed to form the third support pattern 112c, an isotropic etching process may be performed to remove the third mold layer 110c, an anisotropic etching process may be performed to form the second support pattern 112b, an isotropic etching process may be performed to remove the second mold layer 110b, an anisotropic etching process may be performed to form the first support pattern 112a, and then an isotropic etching process may be performed to remove the first mold layer 110a.

Figure 14:
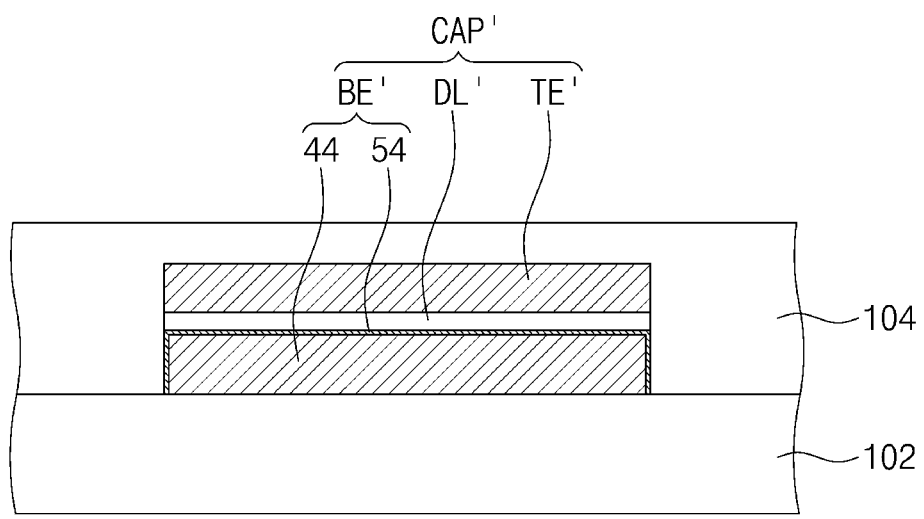
FIG. 14 illustrates a cross-sectional view of a semiconductor device according to some example embodiments.

FIG. 14 illustrates a cross-sectional view showing a semiconductor device according to some example embodiments.

Referring to FIG. 14, a capacitor CAP' may be positioned on the semiconductor substrate 102. The capacitor CAP' may include a bottom electrode BE', a dielectric layer DL', and a top electrode TE'. The bottom electrode BE' may include a first conductive pattern 44 and a second conductive pattern 54 that covers top and lateral surfaces of the first conductive pattern 44. The first conductive pattern 44 may have a height less than a width of the first conductive pattern 44. The first conductive pattern 44 may include the same material as that of the conductive pillars 43 of FIG. 2. The second conductive pattern 54 may include the same material as that of the capping conductive pattern 53 of FIG. 2.

Figure 15:
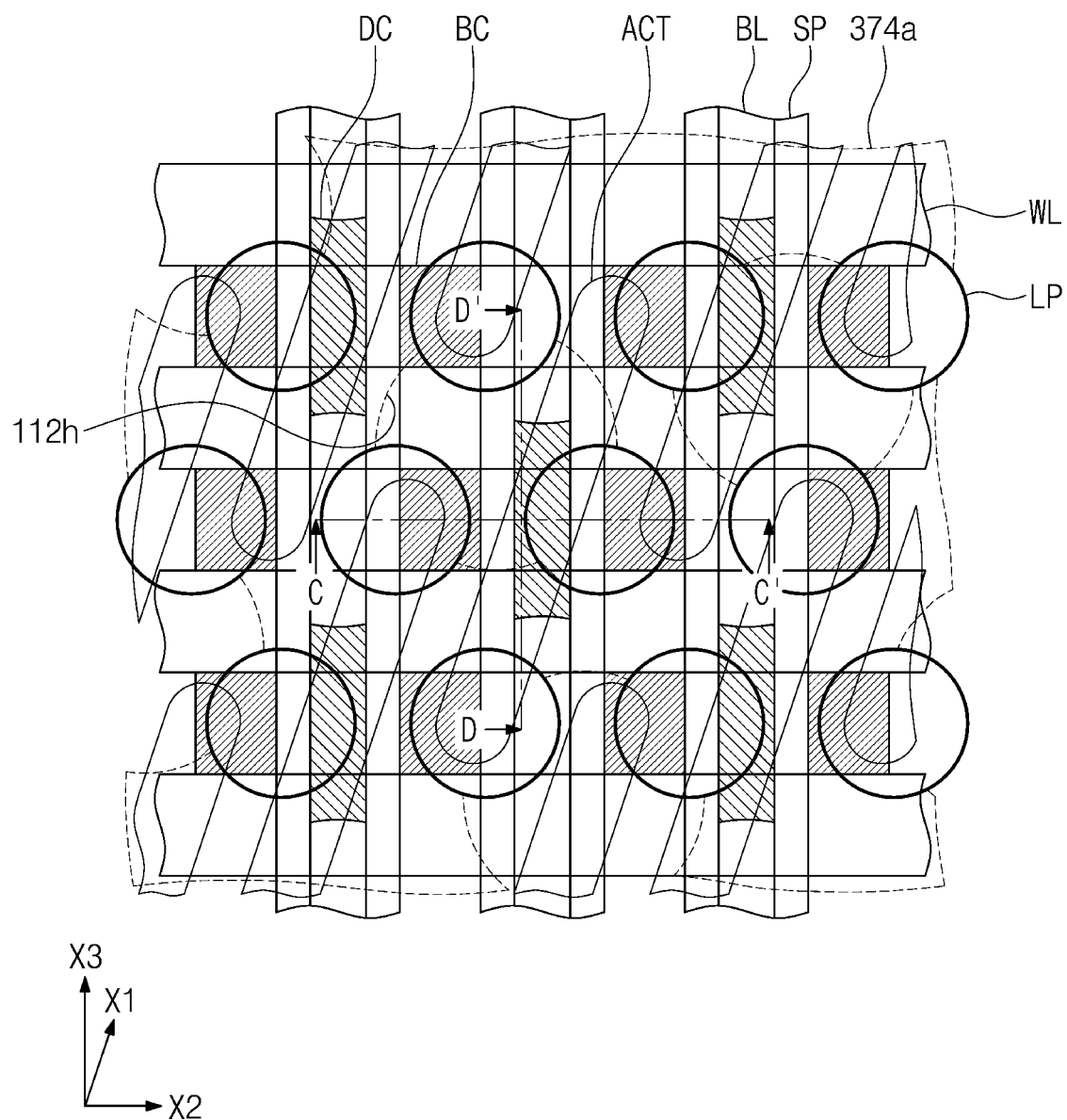
FIG. 15 illustrates a plan view of a semiconductor device according to some example embodiments.
Figure 16:
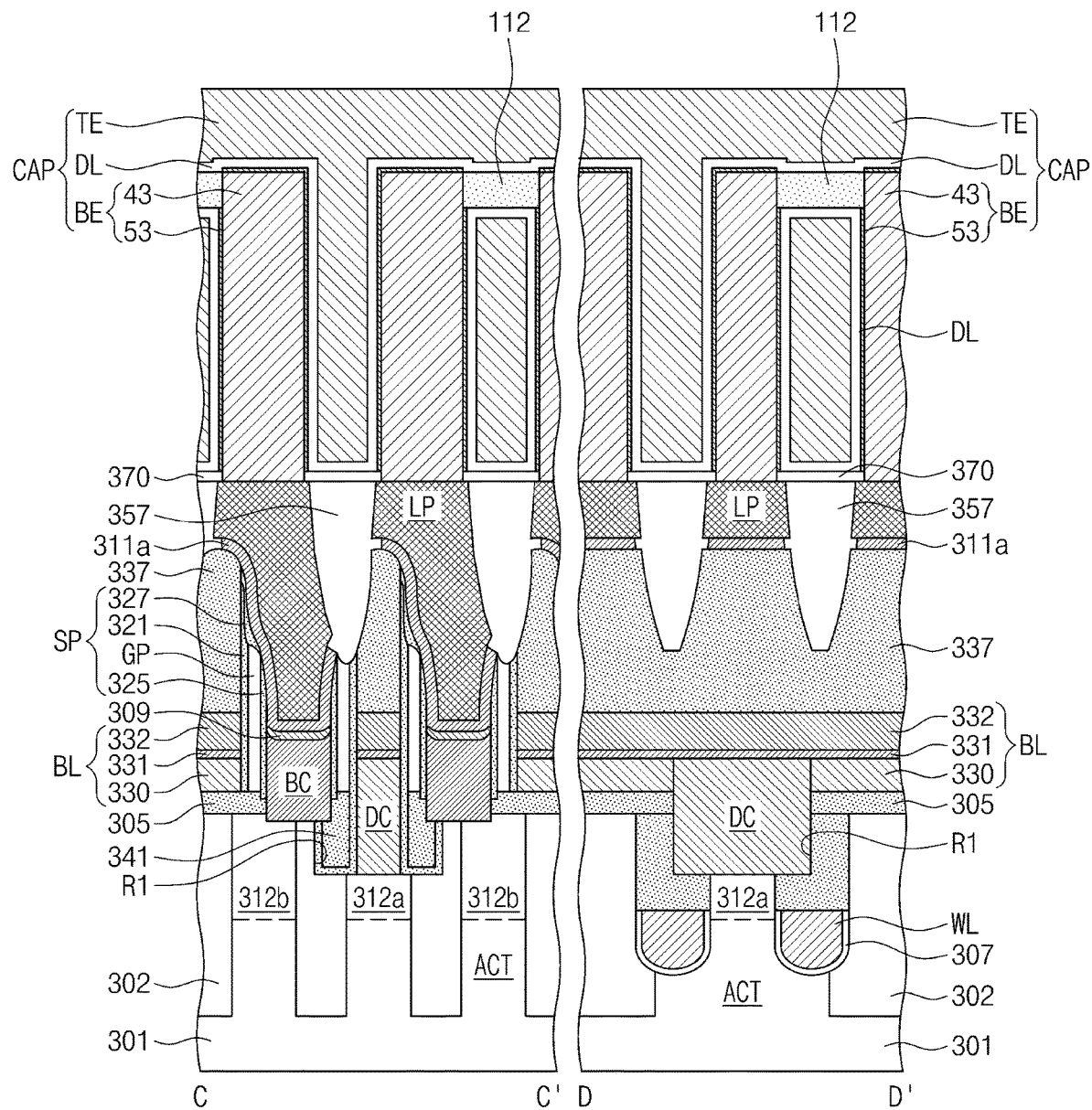
FIG. 16 illustrates a cross-sectional view taken lines C-C' and D-D' of FIG. 15.

FIG. 15 illustrates a plan view showing a semiconductor device according to some example embodiments. FIG. 16 illustrates a cross-sectional view taken along lines C-C' and D-D' of FIG. 15.

Referring to FIGS. 15 and 16, a substrate 301 may be provided thereon with device isolation patterns 302 that define active sections ACT. Each of the active sections ACT may have an isolated shape. Each of the active sections ACT may have a bar shape elongated along a first direction X1 in a plan view. When viewed in a plan view, the active sections ACT may correspond to portions of the substrate 301 that are surrounded by the device isolation patterns 302. The substrate 301 may include a semiconductor material. The active sections ACT may be arranged parallel to each other in the first direction X1, and one of the active sections ACT may have an end portion adjacent to a central portion of a neighboring one of the active sections ACT.

Word lines WL may run across the active sections ACT. The word lines WL may be disposed in grooves formed in the device isolation patterns 302 and the active sections ACT. The word lines WL may be parallel to a second direction X2 that intersects the first direction X1. The word lines WL may be formed of a conductive material. A gate dielectric layer 307 may be disposed between each of the word lines WL and an inner surface of each groove. The grooves may have their bottom surfaces located relatively deeper in the device isolation patterns 302 and relatively shallower in the active sections ACT. The gate dielectric layer 307 may include at least one of, e.g., thermal oxide, silicon nitride, silicon oxynitride, and high-k dielectric. Each of the word lines WL may have a curved bottom surface.

A first doped region 312a may be disposed in the active section ACT between a pair of word lines WL, and a pair of second doped regions 312b may be disposed in opposite edge portions of each active section ACT. The first and second doped regions 312a and 312b may be doped with, e.g., N-type impurities. The first doped region 312a may correspond to a common drain region, and the second doped regions 312b may correspond to source regions. A transistor may be constituted by each of the word lines WL and its adjacent first and second doped regions 312a and 312b. As the word lines WL are disposed in the grooves, each of the word lines WL may have thereunder a channel region whose length becomes increased within a limited planar area. Accordingly, short-channel effects and the like may be reduced or minimized.

The word lines WL may have their top surfaces lower than those of the active sections ACT. A word-line capping pattern 310 may be disposed on each of the word lines WL. The word-line capping patterns 310 may have their linear shapes that extend along longitudinal directions of the word lines WL, and may cover entire top surfaces of the word lines WL. The grooves may have inner spaces not occupied by the word lines WL, and the word-line capping patterns 310 may fill the unoccupied inner spaces of the grooves. The word-line capping pattern 310 may be formed of, e.g., a silicon nitride layer.

An interlayer dielectric pattern 305 may be disposed on the substrate 301. The interlayer dielectric pattern 305 may be formed of a single or multiple layer(s) including at least one of, e.g., a silicon oxide layer, a silicon nitride layer, and a silicon oxynitride layer. The interlayer dielectric pattern 305 may be formed to have island shapes spaced apart from each other when viewed in a plan view. The interlayer dielectric pattern 305 may be formed to simultaneously cover end portions of two adjacent active sections ACT.

Upper portions of the substrate 301, the device isolation pattern 302, and the word-line capping pattern 310 may be partially recessed to form a first recess region R1. The first recess region R1 may have a net or mesh shape when viewed in a plan view. The first recess region R1 may have a sidewall aligned with that of the interlayer dielectric pattern 305.

Bit lines BL may be disposed on the interlayer dielectric pattern 305. The bit lines BL may run across the word-line capping patterns 310 and the word lines WL. As shown in FIG. 15, the bit lines BL may be parallel to a third direction X3 that intersects the first and second directions X1 and X2. Each of the bit lines BL may include a bit-line polysilicon pattern 330, a bit-line ohmic pattern 331, and a bit-line metal-containing pattern 332 that are sequentially stacked. The bit-line polysilicon pattern 330 may include impurity-doped polysilicon or impurity-undoped polysilicon. The bit-line ohmic pattern 331 may include a metal silicide layer. The bit-line metal-containing pattern 332 may include at least one of metal (e.g., tungsten, titanium, and tantalum) and conductive metal nitride (e.g., titanium nitride, tantalum nitride, and tungsten nitride). A bit-line capping pattern 337 may be disposed on each of the bit lines BL. The bit-line capping patterns 337 may be formed of a dielectric material, e.g., a silicon nitride layer.

Bit-line contacts DC may be disposed in the first recess regions R1 that intersect the bit lines BL. The bit-line contacts DC may include impurity-doped polysilicon or impurity-undoped polysilicon. When viewed in cross-section taken along line B-B' as shown in FIG. 16, the bit-line contact DC may have a sidewall in contact with that of the interlayer dielectric pattern 305. When viewed in a plan view, as shown in FIG. 15, the bit-line contact DC may have a concave lateral surface in contact with the interlayer dielectric pattern 305. The bit-line contact DC may electrically connect the first doped region 312a to the bit line BL.

The first recess region R1 may have an empty space not occupied by the bit-line contact DC, and a lower buried dielectric pattern 341 may occupy the empty space of the first recess region R1. The lower buried dielectric pattern 341 may be formed of a single or multiple layer(s) including at least one of, e.g., a silicon oxide layer, a silicon nitride layer, and a silicon oxynitride layer.

Storage node contacts BC may be disposed between a pair of neighboring bit lines BL. The storage node contacts BC may be spaced apart from each other. The storage node contacts BC may include impurity-doped polysilicon or impurity-undoped polysilicon. The storage node contacts BC may have their concave top surfaces. Between the bit lines BL, a dielectric pattern may be disposed between the storage node contacts BC.

A bit-line spacer SP may be interposed between the bit line BL and the storage node contact BC. The bit-line spacer SP may include a first sub-spacer 321 and a second sub-spacer 325 that are spaced apart from each other across a gap GP. The gap GP may be called an air gap. The first sub-spacer 321 may cover a sidewall of the bit line BL and a sidewall of the bit-line capping pattern 337. The second sub-spacer 325 may be adjacent to the storage node contact BC. The first sub-spacer 321 and the second sub-spacer 325 may include the same material. For example, the first sub-spacer 321 and the second sub-spacer 325 may include a silicon nitride layer.

The second sub-spacer 325 may have a bottom surface lower than that of the first sub-spacer 321. The second sub-spacer 325 may have a top end whose height is lower than that of a top end of the first sub-spacer 321. Such a configuration may increase a formation margin for landing pads LP which will be discussed below. As a result, the landing pad LP and the storage node contact BC may be prevented from being disconnected to each other. The first sub-spacer 321 may extend to cover a sidewall of the bit-line contact DC and also to cover a sidewall and a bottom surface of the first recess region R1. For example, the first sub-spacer 321 may be interposed between the bit-line contact DC and the lower buried dielectric pattern 341, between the word-line capping pattern 310 and the lower buried dielectric pattern 341, between the substrate 301 and the lower buried dielectric pattern 341, and between the device isolation pattern 302 and the lower buried dielectric pattern 341.

A storage node ohmic layer 309 may be disposed on the storage node contact BC. The storage node ohmic layer 309 may include metal silicide. The storage node ohmic layer 309, the first and second sub-spacers 321 and 325, and the bit-line capping pattern 337 may be conformally covered with a diffusion stop pattern 311a whose thickness is uniform. The diffusion stop pattern 311a may include metal nitride, such as a titanium nitride layer or a tantalum nitride layer. A landing pad LP may be disposed on the diffusion stop pattern 311a. The landing pad LP may correspond to the bottom electrode contact 106 of FIG. 2. The landing pad LP may be formed of a material containing metal such as tungsten. The landing pad LP may have an upper portion that covers a top surface of the bit-line capping pattern 337 and has a width greater than that of the storage node contact BC. A center of the landing pad LP may shift in the second direction X2 away from a center of the storage node contact BC. A portion of the bit line BL may vertically overlap the landing pad LP. An upper sidewall of the bit-line capping pattern 337 may overlap the landing pad LP and may be covered with a third sub-spacer 327. A pad separation pattern 357 may be interposed between the landing pads LP. The pad separation pattern 357 may correspond to the interlayer insulation layer 104 of FIG. 2. The pad separation pattern 357 may include a silicon nitride layer, a silicon oxide layer, a silicon oxynitride layer, or a porous layer. The pad separation pattern 357 may define a top end of the gap GP.

Bottom electrodes BE may be disposed on corresponding landing pads LP. The bottom electrodes BE may each include the conductive pillar 43 and the capping conductive pattern 53 that covers the surface of the conductive pillar 43 discussed above with reference to FIGS. 1 to 12. A support pattern 112 may connect to each other portions of sidewalls of the conductive pillars 43. The support pattern 112 may include a plurality of support holes 112h.

An etch stop layer 370 may cover a top surface of the pad separation pattern 357 between the bottom electrodes BE. The etch stop layer 370 may include a dielectric material, such as a silicon nitride layer, a silicon oxide layer, and a silicon oxynitride layer. A dielectric layer DL may cover surfaces of the bottom electrodes BE and a surface of the support pattern 112. The dielectric layer DL may be covered with a top electrode TE.

According to some example embodiments, a semiconductor device may be configured such that the gap GP is interposed between the first and second sub-spacers 321 and 325, and that the bit line BL and the storage node contact BC have therebetween reduced parasitic capacitance because a dielectric constant of air/gas/vacuum is less than that of silicon oxide. In addition, because the bottom electrode BE is provided on its surface with the capping conductive pattern 53 whose work function is relatively high, and because the dielectric layer DL is spaced apart from the conductive pillars 43 whose work functions are relatively low, it may be difficult for electrons to escape through the dielectric layer DL from the bottom electrode BE, with the result that the leakage current may reduce and the bottom electrode BE may favorably maintain its stored electrons or electrical information.

Figure 17A:
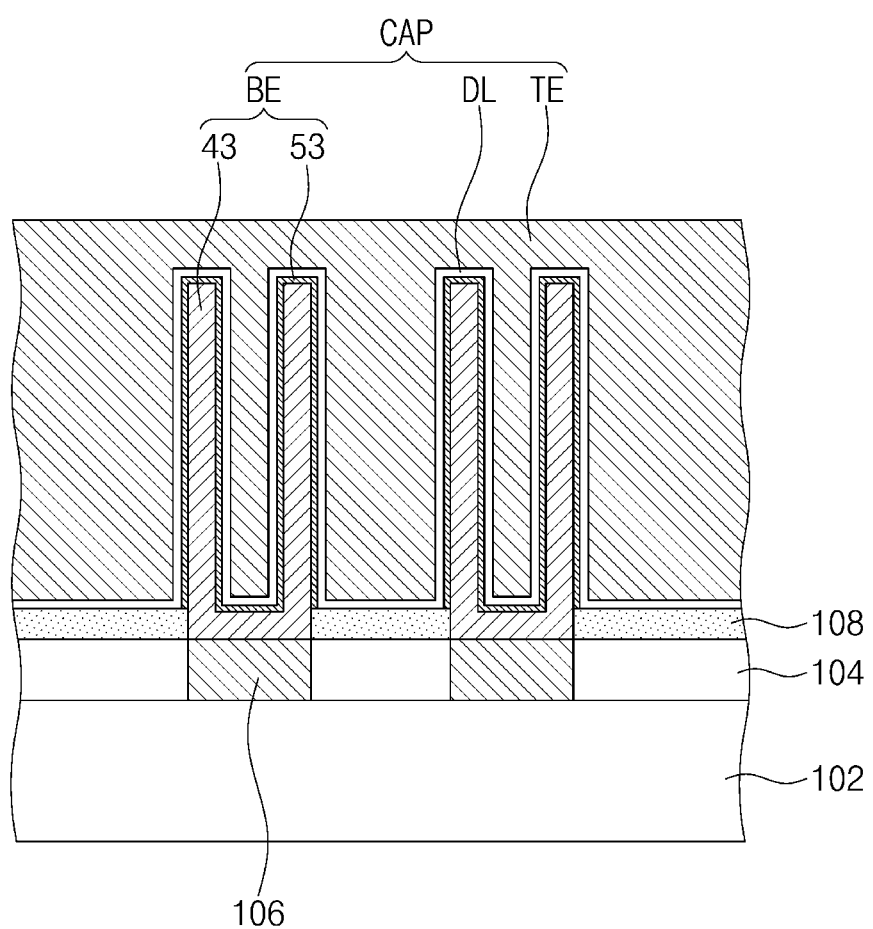
FIG. 17A illustrates a cross-sectional view of a semiconductor device according to some example embodiments.

FIG. 17A illustrates a cross-sectional view showing a semiconductor device according to some example embodiments.

Referring to FIG. 17A, a bottom electrode contact 106 and an interlayer insulation layer 104 may be disposed on a semiconductor substrate 102. An etch stop layer 108 may be disposed on the interlayer insulation layer 104. The etch stop layer 108 may be provided therein with a conductive pillar 43 that penetrates the etch stop layer 108 and contacts the bottom electrode contact 106. The conductive pillar 43 may have a hollow cup or cylindrical shape. A capping conductive pattern 53 may contact top, outer lateral, inner lateral, and inner bottom surfaces of the conductive pillar 43. The capping conductive pattern 53 and the conductive pillar 43 may constitute a bottom electrode BE. A dielectric layer DL and a top electrode TE may be disposed on the bottom electrode BE. The dielectric layer DL may not contact the conductive pillar 43. The capping conductive pattern 53 may not cover the etch stop layer 108. Likewise, the capping conductive pattern 53 of FIG. 3 that scarcely contacts the second support pattern 112b, the capping conductive pattern 53 may rarely contact the etch stop layer 108. None of the support patterns 112a and 112b of FIG. 2 are illustrated in the present embodiment. Instead, the etch stop layer 108 may serve to support the conductive pillars 43. Other configurations may be identical or similar to those discussed above with reference to FIG. 2.

Figure 17B:
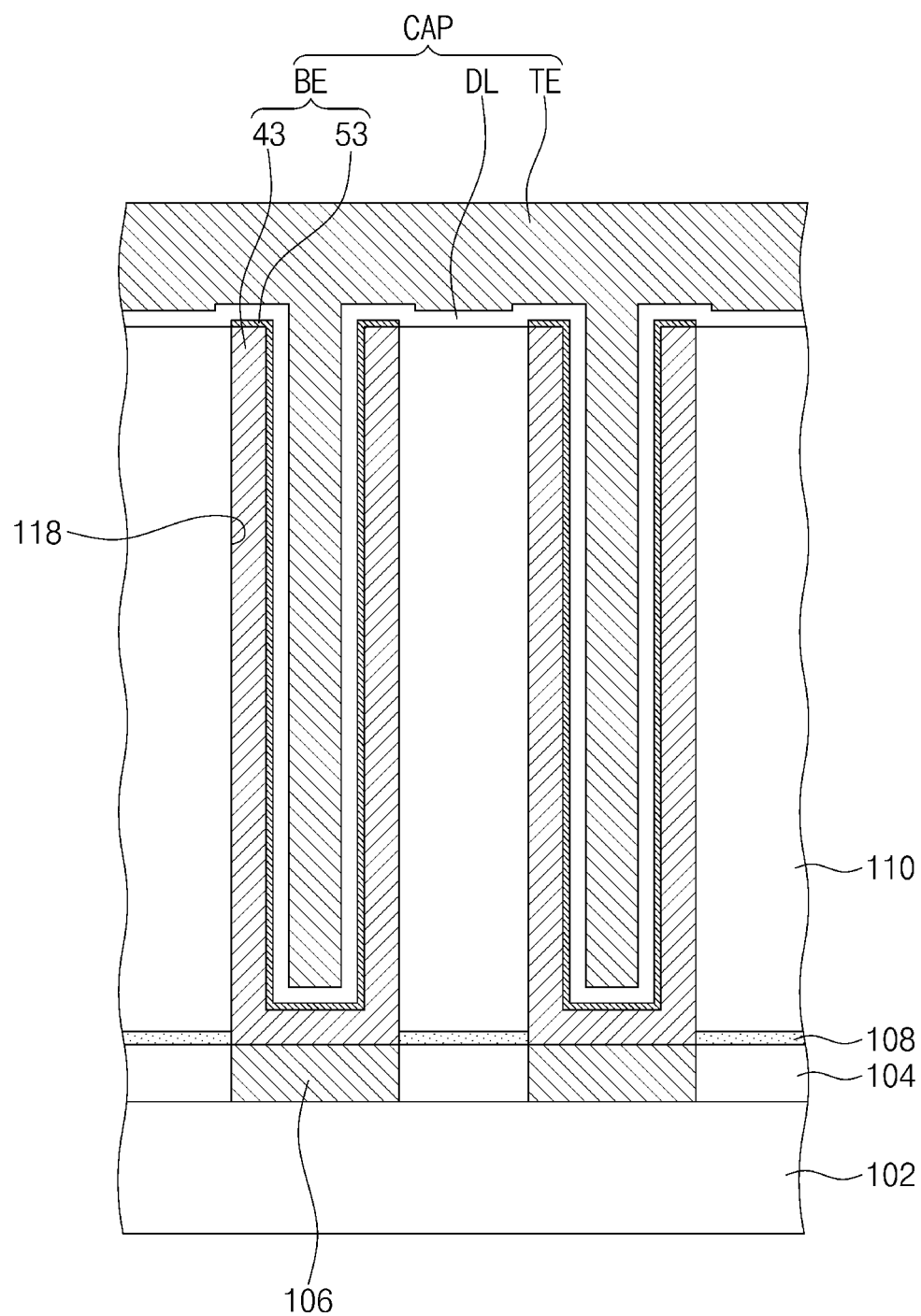
FIG. 17B illustrates a cross-sectional view of a semiconductor device according to some example embodiments.

FIG. 17B illustrates a cross-sectional view showing a semiconductor device according to some example embodiments.

Referring to FIG. 17B, a bottom electrode contact 106 and an interlayer insulation layer 104 may be disposed on a semiconductor substrate 102. An etch stop layer 108 may be disposed on the interlayer insulation layer 104. A mold layer 110 may be disposed on the etch stop layer 108. The mold layer 110 may include a bottom electrode hole 118 that exposes the bottom electrode contact 106. A conductive pillar 43 may be disposed in the bottom electrode hole 118. The conductive pillar 43 may have a hollow cup or cylindrical shape. The conductive pillar 43 may have a top surface coplanar with that of the mold layer 110. A capping conductive pattern 53 may cover top, inner lateral, and inner bottom surfaces of the conductive pillar 43. The capping conductive pattern 53 may have a top surface higher than that of the mold layer 110. The capping conductive pattern 53 may not contact the mold layer 110. A dielectric layer DL and a top electrode TE may be disposed on the capping conductive pattern 53. None of the support patterns 112a and 112b of FIG. 2 are illustrated in the present embodiment. Instead, the mold layer 110 may serve to support the conductive pillars 43. Other configurations may be identical or similar to those of FIG. 2.

Figure 18:
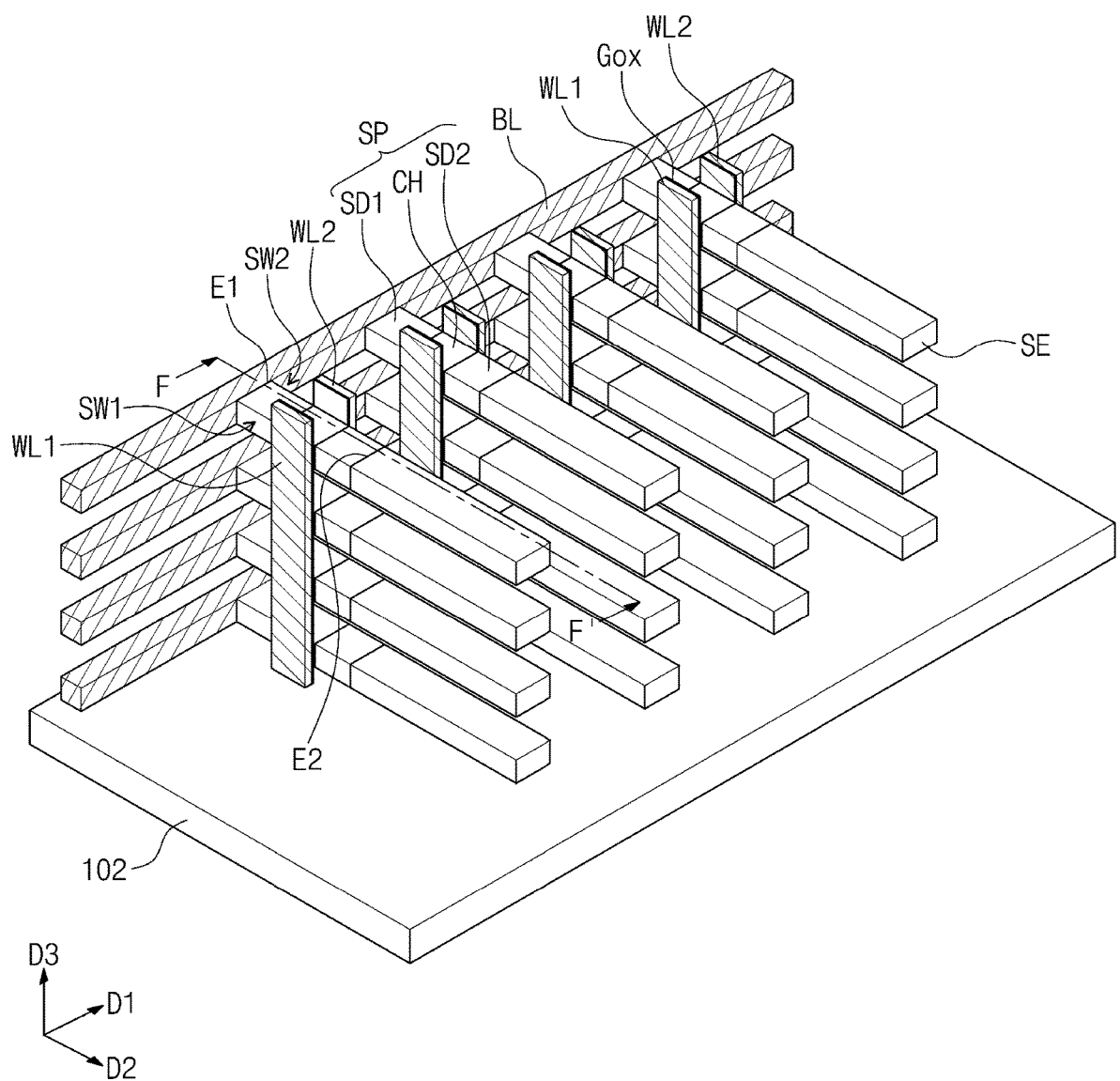
FIG. 18 illustrates a perspective view of a three-dimensional semiconductor memory device according to some example embodiments.
Figure 19:
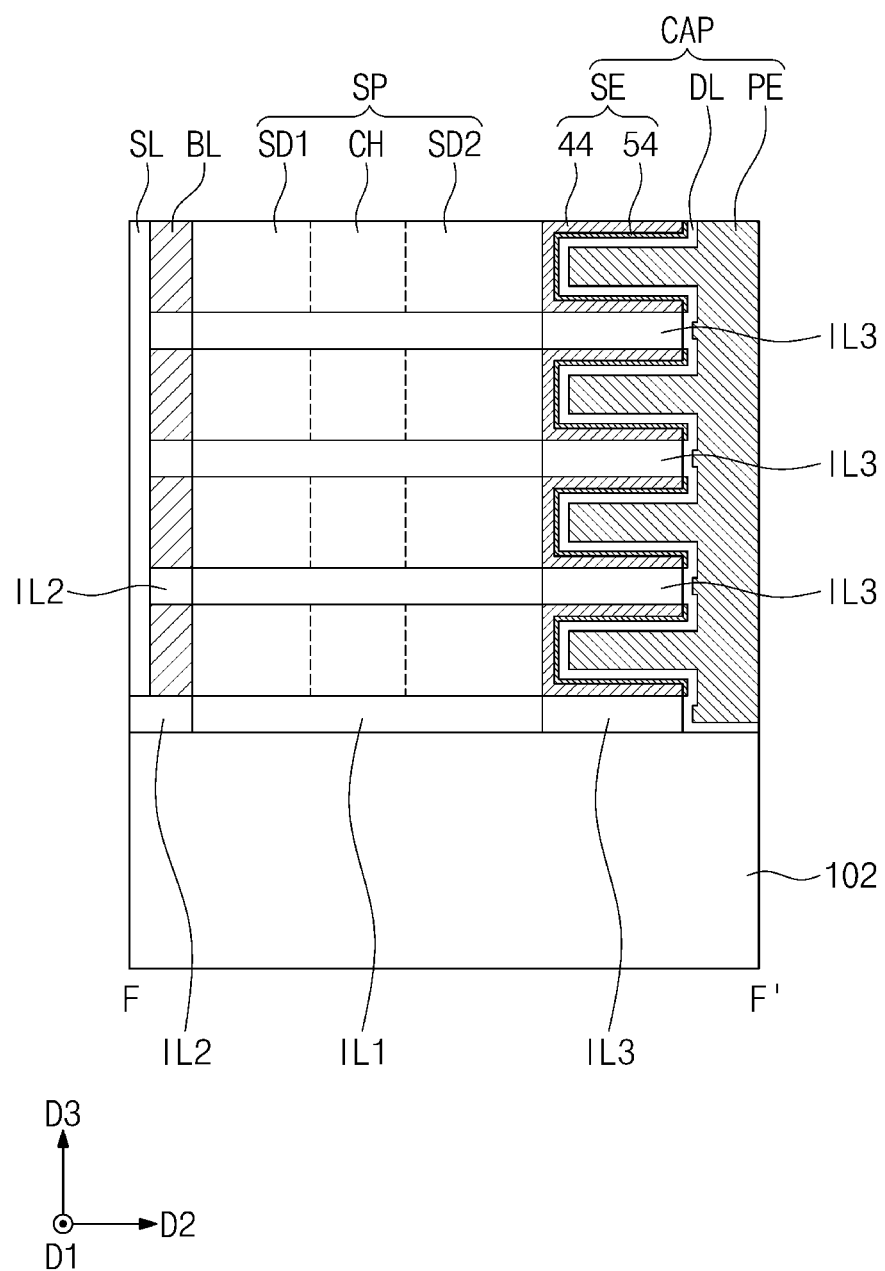
FIG. 19 illustrates a cross-sectional view along line F-F' of FIG. 18.

FIG. 18 illustrates a perspective view showing a three-dimensional semiconductor memory device according to some example embodiments. FIG. 19 illustrates a cross-sectional view taken along line F-F' of FIG. 18.

Referring to FIGS. 18 and 19, a semiconductor substrate 102 may be provided thereon with semiconductor patterns SP that are spaced apart from each other in a first direction D1 and a third direction D3 that intersect each other. The semiconductor patterns SP may each have a bar shape elongated in a second direction D2 that intersects the first and third directions D1 and D3. The first and second directions D1 and D2 may be parallel to a top surface of the semiconductor substrate 102. The third direction D3 may be perpendicular to the top surface of the semiconductor substrate 102. The semiconductor patterns SP may each have a first end portion E1 and a second end portion E2 that are spaced apart from each other. In addition, the semiconductor patterns SP may each have a first lateral surface SW1 and a second lateral surface SW2 that connect the first and second end portions E1 and E2 to each other and are spaced apart from each other. The semiconductor patterns SP may include one or both of silicon and germanium. The semiconductor patterns SP may each include a first source/drain region SD1 adjacent to the first end portion E1, a second source/drain region SD2 adjacent to the second end portion E2, and a channel region CH between the first source/drain region SD1 and the second source/drain region SD2. The first and second source/drain regions SD1 and SD2 may each be an impurity-doped region formed in the semiconductor pattern SP. The channel region CH may also be doped with impurities. For example, the first and second source/drain regions SD1 and SD2 may be doped with impurities having a first conductivity type, and the channel region CH may be doped with impurities having a second conductivity type opposite to the first conductivity type.

The semiconductor substrate 102 may be provided thereon with bit lines BL that are stacked and spaced apart from each other in the third direction D3. The bit lines BL may extend in the first direction D1. The first end portions E1 of the semiconductor patterns SP at the same height may be connected to a single bit line BL.

The second end portion E2 of the semiconductor pattern SP may be connected to a first electrode SE. The first electrode SE may include a first conductive pattern 44 and a second conductive pattern 54. The first conductive pattern 44 may have a hollow cup or cylindrical shape lying on its side. The second conductive pattern 54 may cover inner and lateral surfaces of the first conductive pattern 44.

First word lines WL1 may be adjacent to the first sidewalls SW1 of the semiconductor patterns SP. Second word lines WL2 may be adjacent to the second sidewalls SW2 of the semiconductor patterns SP. The first and second word lines WL1 and WL2 may extend in the third direction D3 from the top surface of the semiconductor substrate 102. One first word line WL1 may be spaced apart from one second word line WL2 across the channel region CH of one semiconductor pattern SP. Gate dielectric layers Gox may be interposed between the semiconductor patterns SP and the first and second word lines WL1 and WL2. The gate dielectric layer Gox may include a high-k dielectric layer, a silicon oxide layer, a silicon nitride layer, a silicon oxynitride layer, or a combination thereof. For example, the high-k dielectric layer may include at least one of, e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The bit lines BL and the first and second word lines WL1 and WL2 may each include a conductive material. For example, the conductive material may include one of a doped semiconductor material (doped silicon, doped germanium, etc.), a conductive metal nitride material (titanium nitride, tantalum nitride, etc.), a metallic material (tungsten, titanium, tantalum, etc.), and a metal-semiconductor compound (tungsten silicide, cobalt silicide, titanium silicide, etc.).

The bit lines BL may extend in the first direction D1. The bit lines BL may contact a separation dielectric pattern SL. When viewed in a plan view, the separation dielectric pattern SL may have a linear shape that extends in the first direction D1.

The first word lines WL1 may serve as gates that substantially dominate charge movement of the channel regions CH. The second word lines WL2 may serve as back gates that assist charge movement of the channel regions CH. A first interlayer insulation layer IL1 may be interposed between the semiconductor patterns SP. A second interlayer insulation layer IL2 may be interposed between the bit lines BL. A third interlayer insulation layer IL3 may be interposed between the first conductive patterns 44. The third interlayer insulation layer IL3 may serve to support the first conductive patterns 44. The separation dielectric pattern SL may contact lateral surfaces of the bit lines BL and lateral surfaces of the first interlayer insulation layers IL1. The first, second, and third interlayer insulation layers ILL IL2, and IL3 and the separation dielectric pattern SL may each be formed of a single or multiple layer(s) including at least one of, e.g., a silicon oxide layer, a silicon oxynitride layer, and a silicon nitride layer.

The second conductive pattern 54 may not contact the third interlayer insulation layer IL3. The second conductive pattern 54 may contact a dielectric layer DL. The dielectric layer DL may contact a second electrode PE. The first electrode SE, the dielectric layer DL, and the second electrode PE may constitute a capacitor CAP. Other configurations may be identical or similar to those discussed above with reference to FIG. 14.

By way of summation and review, line widths of patterns of semiconductor devices are being reduced for high integration thereof. However, new exposure techniques and/or expensive exposure techniques are required for fineness of the patterns such that it is difficult to highly integrate the semiconductor device.

In contrast, example embodiments provide a semiconductor device with increased reliability. Some example embodiments provide a method of fabricating a semiconductor device, which method is capable of increasing process yield.

That is, according to embodiments, a semiconductor device may have one or more bottom electrodes, each of which includes a conductive pillar and a capping conductive pattern that covers an exposed surface of the conductive pillar. The conductive pillars may be covered with the capping conductive patterns on their entire surfaces, with the exception of support patterns, while the capping conductive patterns include a material having a work function that is greater than that of the conductive pillars. As such, because a dielectric layer is spaced apart from the conductive pillars whose work functions are relatively low, it may be difficult for electrons to escape through the dielectric layer from the bottom electrode, with the result that leakage current may reduce and the bottom electrode may favorably maintain its stored electrons or electrical information. As a result, the semiconductor device may increase in reliability.

In addition, according to embodiments, a method of fabricating a semiconductor device may use an area selective deposition process to selectively form the capping conductive pattern on the exposed surface of the conductive pillar. Therefore, because it is not required to additionally perform a process that removes the capping conductive pattern on unwanted regions, it may be possible to simplify processes and to increase process yield.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   conductive pillars on a semiconductor substrate;
   a first support pattern that contacts first portions of lateral surfaces of the conductive pillars and connects the conductive pillars to each other, the first support pattern including first support holes that expose second portions of the lateral surfaces of the conductive pillars, and the second portions of the lateral surfaces of the conductive pillars being in no contact with the first support pattern;

a capping conductive pattern that contacts the second portions of the lateral surfaces of the conductive pillars and exposes the first support pattern, the capping conductive pattern extending vertically along the lateral surfaces of the conductive pillars and having a discontinuous terminal end facing the first support pattern; and a dielectric layer that covers the first support pattern and the capping conductive pattern, the dielectric layer being spaced apart from the conductive pillars.

2. The semiconductor device as claimed in claim 1, wherein:
the capping conductive pattern includes a first metal, and each of the conductive pillars includes a second metal different from the first metal, and
the capping conductive pattern does not include a horizontal portion on the first support pattern that extends in parallel to a longitudinal direction of the first support pattern.

3. The semiconductor device as claimed in claim 1, wherein the conductive pillars include a first material, and the capping conductive pattern includes a second material, the second material having a work function greater than a work function of the first material.

4. The semiconductor device as claimed in claim 1, wherein the capping conductive pattern has a thickness of about 0.3 Å to about 50 Å.

5. The semiconductor device as claimed in claim 1, further comprising an etch stop layer that contacts lower portions of the lateral surfaces of the conductive pillars and covers the semiconductor substrate, the capping conductive pattern exposing the etch stop layer.

6. The semiconductor device as claimed in claim 1, wherein each of the conductive pillars has a hollow cup shape, and the capping conductive pattern extends to contact inner surfaces of the conductive pillars.

7. The semiconductor device as claimed in claim 1, wherein:
each of the conductive pillars includes a lower pillar and an upper pillar on the lower pillar, the upper pillar partially exposing a top surface of the lower pillar, and
the capping conductive pattern contacts a lateral surface of the lower pillar, a lateral surface of the upper pillar, an exposed top surface of the lower pillar, and a top surface of the upper pillar.

8. The semiconductor device as claimed in claim 1, further comprising a second support pattern on the first support pattern and in partial contact with the lateral surfaces of the conductive pillars,
wherein the second support pattern is spaced apart from the first support pattern,
wherein the second support pattern includes a plurality of second support holes that overlap the first support holes, and
wherein the capping conductive pattern does not cover but exposes the second support pattern.

9. The semiconductor device as claimed in claim 1, wherein each of the conductive pillars has a resistivity less than a resistivity of the capping conductive pattern.

10. The semiconductor device as claimed in claim 1, wherein an adhesive force between the first support pattern and one of the conductive pillars is greater than an adhesive force between the first support pattern and the capping conductive pattern.

11. The semiconductor device as claimed in claim 1, wherein a thickness of an edge of the capping conductive pattern decreases as a distance from the first support pattern decreases.

12. The semiconductor device as claimed in claim 1, wherein the dielectric layer contacts the capping conductive pattern and the first support pattern.

13. The semiconductor device as claimed in claim 1, wherein a top surface of the capping conductive pattern is higher than a top surface of the first support pattern, the top surface of the capping conductive pattern being in contact with top surfaces of the conductive pillars.

14. A semiconductor device, comprising:
a device isolation pattern on a substrate and defining an active section;
a word line in the substrate and crossing the active section;
a first impurity region in the active section on a first side of the word line;
a second impurity region in the active section on a second side of the word line;
a bit line connected to the first impurity region and crossing the substrate;
a bottom electrode contact connected to the second impurity region;
a conductive pillar on the bottom electrode contact;
a support pattern in contact with a lateral surface of the conductive pillar;
a capping conductive pattern that contacts an exposed surface of the conductive pillar and exposes the support pattern, the exposed surface being in no contact with the support pattern, and the capping conductive pattern extending vertically along the lateral surface of the conductive pillar and having a discontinuous terminal end facing the support pattern; and
a dielectric layer that covers the support pattern and the capping conductive pattern, the dielectric layer being spaced apart from the conductive pillar.

15. The semiconductor device as claimed in claim 14, wherein the capping conductive pattern includes a first metal, and the conductive pillar includes a second metal different from the first metal.

16. The semiconductor device as claimed in claim 14, wherein:
the conductive pillar includes a first material, and
the capping conductive pattern includes a second material, the second material having a work function greater than a work function of the first material.

17. The semiconductor device as claimed in claim 14, wherein a thickness of an edge of the capping conductive pattern decreases as a distance from the support pattern decreases.

18. A semiconductor device, comprising:
conductive pillars on a semiconductor substrate;
a support pattern that extends continuously to contact first portions of lateral surfaces of all the conductive pillars and to connect all the conductive pillars to each other, as viewed in a top view, the support pattern including support holes that expose second portions of the lateral surfaces of the conductive pillars, and each of the support holes exposing the second portions of at least three of the conductive pillars; and
a capping conductive pattern that contacts the second portions of the lateral surfaces of the conductive pillars, the capping conductive pattern exposing the support pattern, and the second portions of the lateral surfaces of the conductive pillars having no contact with the support pattern, wherein the capping conductive pattern extends vertically along the lateral surfaces of the conductive pillars and has a discontinuous terminal end that faces the support pattern, and wherein the capping conductive pattern has a predetermined thickness adjacent to a region where the support pattern contacts each of the conductive pillars, wherein the predetermined thickness decreases as a distance from the support pattern decreases.

19. The semiconductor device as claimed in claim 18, further comprising a dielectric layer in contact with the support pattern and the capping conductive pattern, the dielectric layer being spaced apart from each of the conductive pillars.

20. The semiconductor device as claimed in claim 18, wherein:

each of the conductive pillars includes a first material, and
the capping conductive pattern includes a second material, the second material having a work function greater than a work function of the first material.

\* \* \* \* \*